United States Patent
Yamane

(10) Patent No.: US 10,937,937 B2
(45) Date of Patent: Mar. 2, 2021

(54) OPTICAL SEMICONDUCTOR ELEMENT

(71) Applicant: STANLEY ELECTRIC CO., LTD., Tokyo (JP)

(72) Inventor: Takayoshi Yamane, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/509,493

(22) Filed: Jul. 12, 2019

(65) Prior Publication Data
US 2020/0020838 A1    Jan. 16, 2020

(30) Foreign Application Priority Data
Jul. 13, 2018  (JP) .............................. JP2018-133328

(51) Int. Cl.
*H01L 23/00* (2006.01)
*H01L 33/62* (2010.01)
(Continued)

(52) U.S. Cl.
CPC ............ *H01L 33/62* (2013.01); *H01L 33/486* (2013.01); *H01L 33/60* (2013.01)

(58) Field of Classification Search
CPC ................................ H01L 2224/48227; H01L 2224/13006–13007; H01L 33/62;
(Continued)

(56) References Cited

U.S. PATENT DOCUMENTS 4,480,261 A * 10/1984 Hattori ................ H01L 23/4924
257/753
4,733,127 A * 3/1988 Takasu ...................... B41J 2/45
257/E25.02

(Continued)

FOREIGN PATENT DOCUMENTS

EP   2 290 676 A1   3/2011
EP   2 455 966 A1   5/2012
(Continued)

OTHER PUBLICATIONS

Extended European Search Report dated Nov. 14, 2019, issued in corresponding European Patent Application No. 19186106.1.

*Primary Examiner* — Bitew A Dinke
(74) *Attorney, Agent, or Firm* — Xsensus LLP

(57) ABSTRACT

Provided is an optical semiconductor element in which an unbonded portion between an optical semiconductor chip and a submount is made small, heat dissipation efficiency becomes high, and service life can be made long. The optical semiconductor element can include: a submount; a submount electrode provided on a mounting surface of the submount and having a rectangular shape as a whole; and a semiconductor chip including an element substrate, a semiconductor structure layer formed on the element substrate, and a chip electrode bonded to the submount electrode via a bonding layer. The chip electrode has a shape with chipped corners corresponding to four corners of the submount electrode, which has an exposed surface that is a portion exposed from the chip electrode at the four corners and bonded to the chip electrode to coincide with each other. The bonding layer extends to all the four corners of the exposed surface.

17 Claims, 15 Drawing Sheets

(51) Int. Cl.
 *H01L 33/48* (2010.01)
 *H01L 33/60* (2010.01)
(58) Field of Classification Search
 CPC ......... H01L 33/486; H01L 2224/29013; H01L 2224/29082–29084; H01L 2224/3226; H01L 24/29; H01L 33/007; H01L 24/32; H01L 2924/12041; H01L 2224/32013; H01L 2224/32014
 See application file for complete search history.

(56) References Cited

U.S. PATENT DOCUMENTS

| | | | | |
|---|---|---|---|---|
| 5,731,635 | A * | 3/1998 | Bareither | H01L 23/4924 257/763 |
| 6,125,043 | A * | 9/2000 | Hauer | H01L 23/13 361/760 |
| 6,573,537 | B1 * | 6/2003 | Steigerwald | H01L 33/405 257/103 |
| 2005/0051788 | A1 * | 3/2005 | Tatsumi | H01L 24/32 257/99 |
| 2006/0043387 | A1 * | 3/2006 | Hata | H01L 33/20 257/79 |
| 2006/0157717 | A1 * | 7/2006 | Nagai | H01L 33/22 257/81 |
| 2010/0052004 | A1 * | 3/2010 | Slater, Jr. | H01L 33/40 257/99 |
| 2010/0084675 | A1 * | 4/2010 | Ueno | H01L 33/508 257/98 |
| 2010/0201254 | A1 * | 8/2010 | Matsumura | H01L 24/32 313/501 |
| 2011/0067911 | A1 * | 3/2011 | Ishikawa | H01L 23/49838 174/261 |
| 2011/0254039 | A1 * | 10/2011 | Kim | H01L 24/97 257/98 |
| 2012/0112622 | A1 * | 5/2012 | Suzuki | H01L 24/06 313/326 |
| 2013/0032810 | A1 * | 2/2013 | Chen | H01L 33/10 257/76 |
| 2015/0245483 | A1 * | 8/2015 | Miyasaka | H05K 3/4015 303/20 |
| 2015/0249193 | A1 * | 9/2015 | Hong | H01L 33/505 257/98 |

FOREIGN PATENT DOCUMENTS

| | | |
|---|---|---|
| EP | 2 914 072 A1 | 9/2015 |
| JP | 2013-33969 A | 2/2013 |
| WO | 02/067291 A2 | 8/2002 |
| WO | 2005/106497 A2 | 11/2005 |

* cited by examiner

OPTICAL SEMICONDUCTOR ELEMENT

This application claims the priority benefit under 35 U.S.C. § 119 of Japanese Patent Application No. 2018-133328 filed on Jul. 13, 2018, which is hereby incorporated in its entirety by reference.

TECHNICAL FIELD

The present invention relates to an optical semiconductor element such as a light-emitting diode (LED).

BACKGROUND ART

There is known an optical semiconductor element such as an LED in which an optical semiconductor chip is bonded to a sub-mount for heat dissipation and installed. At the time of the bonding, a conductive die attach material such as AuSn is used, so that the semiconductor structure layer and the submount are bonded to each other through the die attach material.

For example, Japanese Patent Application Laid-Open No. 2013-033969 discloses an LED in which an LED chip is bonded onto a submount via a bond pad (claim 12 and the like in this publication). The publication also discloses that the bond pads are formed of Au or any suitable metal alloy such as Au/Sn, Pb/Sn, Sn, and Sn/Ag (paragraph [0017], and the like in this publication).

In the bonding between optical semiconductor layer and the submount as described above, there has been a problem in that the efficiency of heat dissipation may be lowered due to voids generated in the bonding layer formed of the die attach material, uneven spreading of the die attach material, and the like.

SUMMARY

The present invention was devised in view of these and other problems and features in association with the conventional art. According to an aspect of the present invention, there can be provided an optical semiconductor element in which an unbonded portion between an optical semiconductor chip and a submount is made small, the heat dissipation efficiency becomes high, and the service life can be made long.

According to another aspect of the present invention, an optical semiconductor element can include: a plate-shaped submount having a mounting surface; a submount electrode provided on the mounting surface of the submount and having a rectangular shape as a whole; and a semiconductor chip including an element substrate, a semiconductor structure layer formed on the element substrate, and a chip electrode bonded to the submount electrode via a bonding layer, wherein the chip electrode has a shape with chipped corners corresponding to four corners of the submount electrode, the submount electrode has an exposed surface that is a portion exposed from the chip electrode at the four corners and bonded to the chip electrode to coincide with each other, and the bonding layer extends to all the four corners of the exposed surface.

In the optical semiconductor element according to the foregoing aspect, the submount electrode may include two submount electrode pieces each having a rectangular shape and are disposed apart from each other, the chip electrode may include two chip electrode pieces each having a shape and arrangement that coincide with the respective submount electrode pieces except that corners thereof corresponding to the four corners of the submount electrode are lacking, and the two submount electrode pieces and the two chip electrode pieces may be bonded to each other, while coinciding with each other, except for the four corners. Further in this optical semiconductor element, each of the two chip electrode pieces may have chipped corners corresponding to the respective four corners of the two submount electrode pieces, each of the two submount electrode pieces may have the exposed surface at the respective four corners, and the bonding layer may extend to all the exposed surfaces at the four corners.

Further in the optical semiconductor element according to the forgoing aspect, the submount electrode may include first to n-th (n≥2) submount electrode pieces each having a stripe shape and may be disposed apart from each other, the chip electrode may include first to n-th chip electrode pieces each having a shape and arrangement that coincide with the respective submount electrode pieces except for corners thereof corresponding to the four corners of the submount electrode, and having both ends that correspond to both ends of the first to n-th submount electrode pieces and are lacking, and each of the submount electrode pieces and each of the chip electrode pieces may be bonded to each other, while coinciding with each other, except for the four corners.

Alternatively, in the optical semiconductor element according to the forgoing aspect, the submount electrode may include first to n-th (n≥2) submount electrode pieces each having a stripe shape and may be disposed apart from each other, the chip electrode may include first to n-th chip electrode pieces each having a shape and arrangement that coincide with the respective submount electrode pieces except for ends of the respective submount electrode pieces, and having both ends that correspond to both ends of the submount electrode pieces and are lacking, each of the submount electrode pieces may have exposed surfaces at both the ends thereof which are exposed portions from each of the chip electrode pieces, and the bonding layer may extend to the exposed surfaces of each of the submount electrode pieces.

In any of these optical semiconductor elements, the first to n-th submount electrode pieces may be disposed in n rows such that long sides of the stripe shapes are arranged in parallel with each other, the semiconductor chip may have a chip-side opposite electrode apart from the first to n-th chip electrode pieces, and the submount may have a submount-side opposite electrode that is disposed on the mounting surface apart from the submount electrode and bonded to the chip-side opposite electrode via the bonding layer. In this case, the semiconductor structure layer may include a first conductivity type semiconductor layer, an active layer, and a second conductivity type semiconductor layer, the first to n-th chip electrode pieces may be electrically connected to the first conductivity type semiconductor layer, the first conductivity type semiconductor layer may have a first electrode layer with a comb-tooth shape including a comb-tooth portion having a shape and an arrangement corresponding to the respective first to n-th chip electrode pieces, and a base portion connecting one ends of the comb-tooth portions, and the second conductive type semiconductor layer may have a second electrode layer with a comb-tooth shape including a base portion electrically connected to the chip-side opposite electrode, and a comb-tooth portion extending in spaces between adjacent ones of the first to n-th chip electrode pieces.

In the optical semiconductor element according to any one of the foregoing aspects, the bonding layer may extend to cover all the respective exposed surfaces.

Further in the optical semiconductor element according to any one of the foregoing aspects, the element substrate may have a light-transmitting property with respect to light at a predetermined wavelength.

Further in the optical semiconductor element according to any one of the foregoing aspects, the element substrate may have a light-transmitting property with respect to light in a visible wavelength region.

According to still another aspect of the present invention, an optical semiconductor element can include: a plate-shaped submount having a mounting surface; a submount electrode provided on the mounting surface of the submount; and a semiconductor chip including an element substrate, a semiconductor structure layer formed on the element substrate, and a chip electrode bonded to the submount electrode via a bonding layer, and having a rectangular shape as a whole, wherein the submount electrode has a shape with chipped corners corresponding to four corners of the chip electrode, the chip electrode has an exposed surface that is a portion exposed from the submount electrode at the four corners and bonded to the submount electrode to coincide with each other, and the bonding layer extends to all the four corners of the exposed surfaces. In this optical semiconductor element, the submount may have a light-transmitting property with respect to light at a predetermined wavelength.

BRIEF DESCRIPTION OF DRAWINGS

These and other characteristics, features, and advantages of the present invention will become clear from the following description with reference to the accompanying drawings, wherein.

DESCRIPTION OF EXEMPLARY EMBODIMENTS

Figure 1:
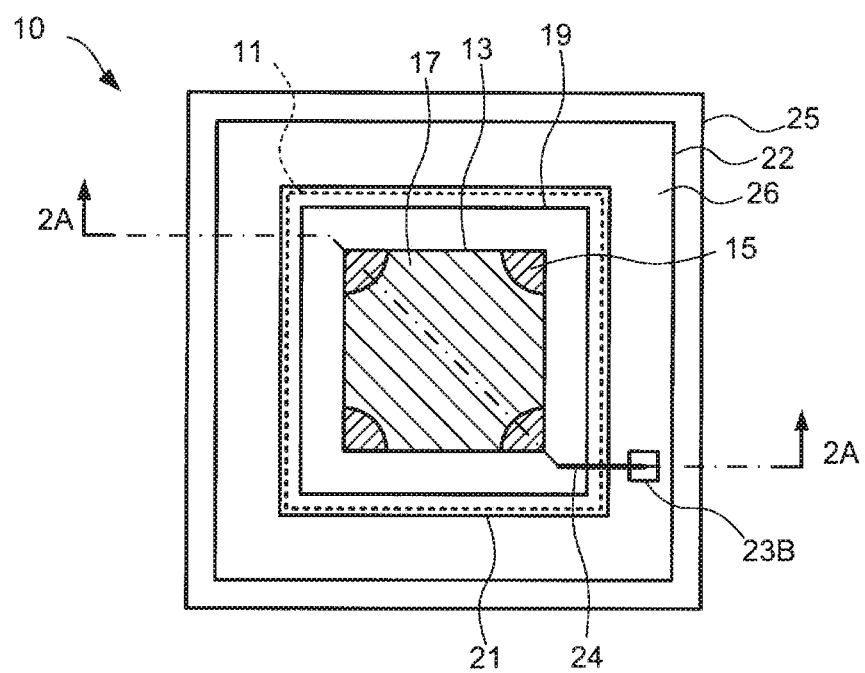
FIG. 1 is a top view of a light-emitting device according to a first exemplary embodiment made in accordance with principles of the present invention.

A description will now be made below to optical semiconductor elements of the present invention with reference to the accompanying drawings in accordance with exemplary embodiments. In the following description and the accompanying drawings, substantially the same or equivalent parts are denoted by the same reference numerals. In addition, in the top view of the accompanying drawings, some of the components are appropriately hatched for the sake of clarity.

First Exemplary Embodiment

Figure 2A:
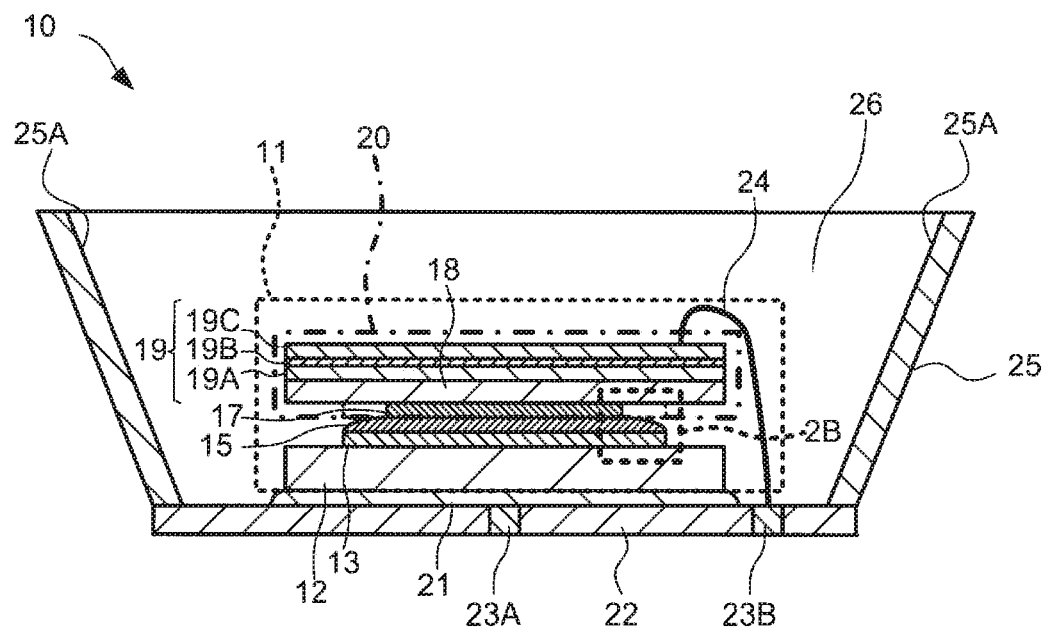
FIG. 2A is a cross-sectional view of the light-emitting device according to the first exemplary embodiment.
Figure 2B:
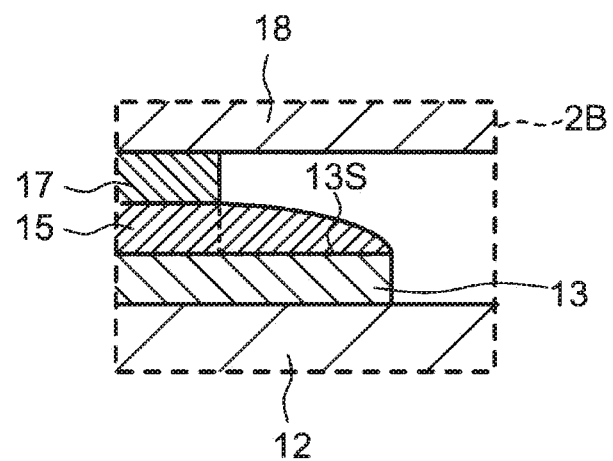
FIG. 2B is a partially enlarged cross-sectional view of the light-emitting device according to the first exemplary embodiment.

Referring to FIGS. 1, 2A, and 2B, a configuration of a light-emitting device 10 according to the present exemplary embodiment will be described. The light-emitting device 10 includes an optical semiconductor element 11 of the present invention. FIG. 1 is a top view illustrating the configuration of the light-emitting device 10. FIG. 2A is a cross-sectional view of the light-emitting device 10 taken along line 2A-2A in FIG. 1. In FIG. 1, for the purpose of explanation, some of the components are hatched.

First, a configuration of the optical semiconductor element 11 will be described. The optical semiconductor element 11 includes a submount 12 which is a plate-shaped (flat) substrate having a mounting surface. As the submount 12, for example, a substrate made of alumina, AlN ceramic, SiC, or the like is used. In the present exemplary embodiment, a case where the submount 12 is made of AlN ceramic having high thermal conductivity will be described.

As shown in FIG. 2A, further included is a submount electrode 13 which is an electrode pattern formed on the mounting surface of the submount 12. As illustrated in FIG. 1, the submount electrode 13 has a rectangular shape in a top view. For example, the submount electrode 13 is made of a metal such as Ti, Pt, Au, Pd, Cr, Ni, Cu, W, or Al.

As shown in FIG. 2A, further included is a bonding layer 15 which is formed of a conductive bonding material on the submount electrode 13. Examples of the material used as the bonding layer 15 may include conductive materials such as a conductive paste, a solder material, a sinterable Ag particle paste, and an anisotropic conductive paste. In this exemplary embodiment, the bonding layer 15 is made of AuSn.

Further included is a chip electrode 17 which is an electrode pattern provided on the bonding layer 15. That is, the chip electrode 17 is bonded to the submount electrode 13 via the bonding layer 15. For example, the chip electrode 17 may be formed by combining metals such as Ti, Al, Au, and Ni, or may be formed by using other metals such as Pt, W, Pd, Cr, and Cu.

In FIG. 1, the bonding layer 15 and the chip electrode 17 are hatched. As illustrated in FIG. 1, the chip electrode 17 has a shape that coincides with the submount electrode 13 except for four corners of the submount electrode 13 in a top view, with chipped corner portions corresponding to the four corners. In other words, the chip electrode 17 has a planar shape that coincides with the submount electrode 13 except that the four corners are missing. The submount electrode 13 is bonded to the chip electrode 17 except for the four corners.

Further included is an element substrate 18 which is a plate-like substrate, and is formed on the chip electrode 17 as shown in FIG. 2A. For example, the element substrate 18 is a substrate having a light-transmitting property with respect to visible light, and examples thereof may include sapphire, SiC, and AlN substrates. For example, the element substrate 18 may have through holes (not shown) connected to the chip electrodes 17. The element substrate 18 may be a substrate having conductivity such as ITO or the like, or may be a substrate composed of a plurality of layers.

Further included is a semiconductor structure layer 19 which is formed on the element substrate 18. The semiconductor structure layer 19 is formed by stacking a p-type semiconductor layer 19A, an active layer 19B (or a light-emitting layer), and an n-type semiconductor layer 19C on the element substrate 18 in this order. In the optical semiconductor element 11, light from the light-emitting layer 19B is emitted from the upper surface of the n-type semiconductor layer 19C. That is, the upper surface of the n-type semiconductor layer 19C becomes the light-emitting surface.

The wavelength of the light emitted from the light-emitting layer 19B corresponds to the material and composition of the semiconductor structure layer 19. For example, the wavelength of the light emitted from the light-emitting layer 19B may be a wavelength in the infrared region or a wavelength in the deep ultraviolet region.

As illustrated in FIG. 2A, the chip electrode 17, the element substrate 18, and the semiconductor structural layer 19 constitute a semiconductor chip 20. Thus, the optical semiconductor element 11 has the semiconductor chip 20 bonded onto the submount electrode 13 with the bonding layer 15 interposed therebetween. In the present exemplary embodiment, the semiconductor chip 20 is an element having a thin film (Thin-film) type bonding structure (or a metal bonding structure (MB structure)).

Further provided is a power supply adhesive 21 which is formed on the surface opposite to the mounting surface of the submount 12, and is an adhesive having conductivity. The power supply adhesive 21 is made of a conductive material such as AuSn, for example. Further provided is a package substrate 22 which has a mounting surface on which elements such as LEDs can be mounted. The package substrate 22 is, for example, a ceramic substrate such as an AlN or alumina substrate. A substrate such as a glass epoxy substrate may be adopted as the package substrate 22. As described above, the optical semiconductor element 11 is mounted on the package substrate 21 via the power supply adhesive 21.

There are provided power supply pads 23A and 23B which are electrodes provided on the mounting surface of the package substrate 22, and serve as connection electrodes which are connected to an external circuit and receive a current supply. The power supply pad 23A is electrically connected to the submount electrode 13 via a wiring (not shown) provided on the submount 12. Accordingly, the power supply pad 23A is electrically connected to the p-type semiconductor layer 19A via the submount electrode 13, the bonding layer 15, and the chip electrode 17. The power supply pad 23B is electrically connected to the n-type semiconductor layer 19C via the bonding wire 24.

The device includes a reflector 25 which is a frame body provided on the package substrate 22 and has an inner wall 25A. For example, the inner wall 25A has a shape corresponding to a side surface of an inverted truncated pyramid extending in a direction away from the upper surface of the package substrate 22. A cavity 26 having an inverted truncated pyramid shape is defined by the upper surface of the package substrate 22 and the inner wall 25A. That is, the optical semiconductor element 11 is accommodated in the cavity 26 and packaged. For example, a ceramic integrated with the package substrate 22 is used as the reflector 25.

FIG. 2B is an enlarged view of a portion 2B surrounded by a broken line in FIG. 2A. As described above, the submount electrode 13 is bonded to the chip electrode 17 via the bonding layer 15. The chip electrode 17 has a shape in which corner portions corresponding to the four corners of the submount electrode are lacking (chipped corners). Therefore, the submount electrode 13 has exposed surfaces 13S, which are each a portion exposed from the chip electrode 17, at the four corners.

As shown in FIG. 2B, the bonding layer 15 extends to the exposed surfaces 13S of the submount electrode 13. In this exemplary embodiment, the bonding layer 15 extends so as to cover the entire exposed surfaces 13S. As illustrated in FIG. 1, the bonding layer 15 extends to all the exposed surfaces 13S at the four corners of the submount electrode 13.

Figure 3A:
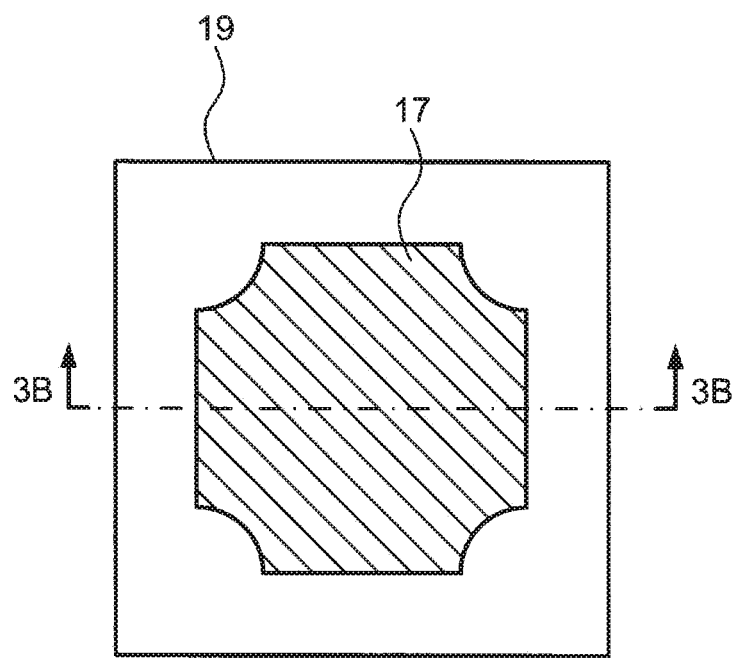
FIG. 3A is a top view illustrating an example of a production process of an optical semiconductor element according to the first exemplary embodiment.

Referring to FIGS. 3A to 5B, an exemplary production process of the optical semiconductor element 11 will be described. FIG. 3A is a top view of the semiconductor chip 20, and FIG. 3B is a cross-sectional view taken along line 3B-3B of FIG. 3A.

Figure 3B:
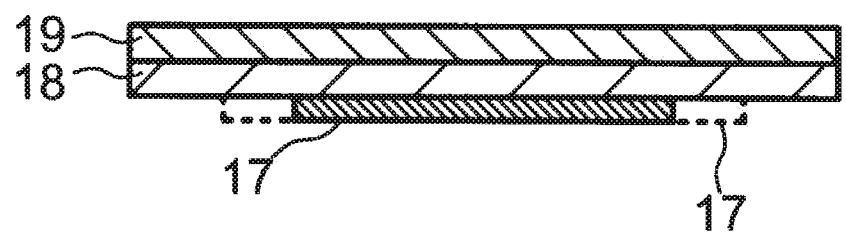
FIG. 3B is a cross-sectional view of the optical semiconductor element according to the first exemplary embodiment.

As illustrated in FIG. 3A and FIG. 3B, the semiconductor chip 20 includes the semiconductor structural layer 19 on the outermost surface, the element substrate 18 below the layer 19, and the chip electrode 17 below the substrate 18. As shown in FIG. 3A, the chip electrode 17 has a rectangular shape with chipped four corners.

For example, the semiconductor structural layer 19 may be formed by growing the n-type semiconductor layer 19C, the light-emitting layer 19B, and the p-type semiconductor layer 19A on a growth substrate, which is a substrate different from the element substrate 18, by a method such as MOCVD (Metal Organic Chemical Vapor Deposition), bonding the grown semiconductor layer to the element substrate 18, and removing the growth substrate.

Then, on the surface of the element substrate 18 opposite to the surface to which the semiconductor structure layer 19 has been bonded, an electrode pattern is formed through processes such as deposition of metal, lithography, sputtering, and etching to form the chip electrode 17.

Figure 4A:
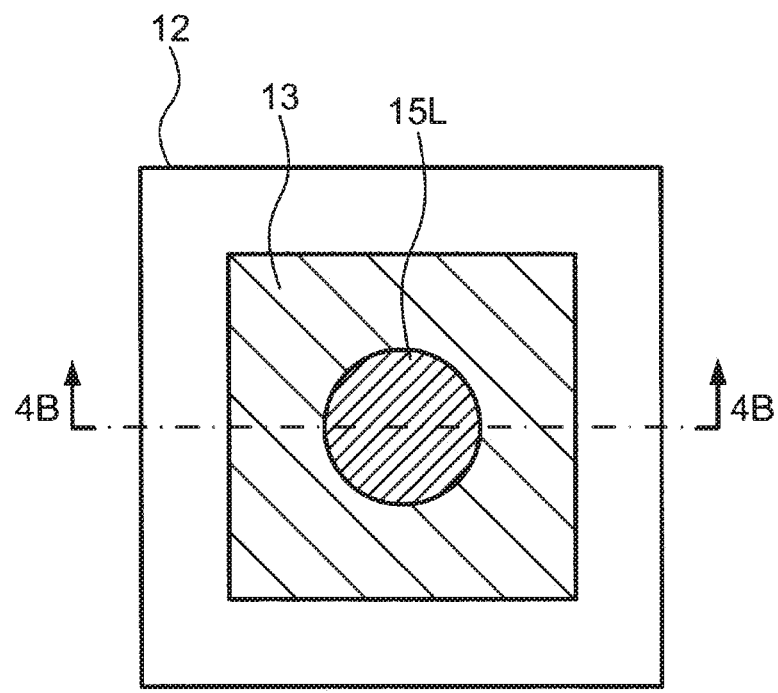
FIG. 4A is a top view illustrating an example of the production process of the optical semiconductor element according to the first exemplary embodiment.
Figure 4B:
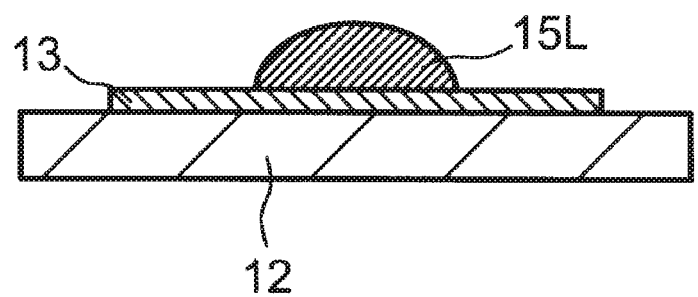
FIG. 4B is a cross-sectional view of the optical semiconductor element according to the first exemplary embodiment.

FIG. 4A is a top view illustrating the submount 12, the submount electrode 13, and the die attach material (or DA material) 15L disposed on the submount electrode 13. FIG. 4B is a cross-sectional view taken along line 4B-4B of FIG. 4A.

As described above, the DA material 15L is a conductive material such as a conductive paste or a solder material, and in the present exemplary embodiment, AuSn is adopted as an example. The DA material 15L is disposed in the center portion of the submount electrode 13 using, for example, a dispenser. For example, an appropriate applied amount (discharge amount) of the DA material 15L may be determined as a volume calculated front a desired thickness of the bonding layer 15 and the area of the submount electrode 13. For example, the volume of the DA material to be applied is calculated so that the thickness of the bonding layer 15 becomes about 10 to 20 µm. As necessary, a flux may be applied to improve the wettability of the bonding member or layer.

The position where the DA material 15L is to be disposed may preferably a position farthest from the four corners of the submount electrode 13, and where the distances from the four corners are equal to each other, which is set as a center position. The DA material 15L is preferably disposed so as to have a spherical (hemispherical) shape. The DA material 15L disposed in this manner is less likely to entrain air when the DA material 15L spreads, whereby an unbonded portion such as a void is hardly generated in the bonding layer 15.

Thereafter, the semiconductor chip 20 is placed on the submount electrode 13 in a direction in which the chip electrode 17 is in contact with the DA material 15L. At this time, the semiconductor chip 20 is mounted so that the submount electrode 13 and the chip electrode 17 coincide with each other except for the four corners of the submount electrode 13.

When a load is applied to a position of the semiconductor chip 20 corresponding to the center of the DA material 15L after the DA material 15L has been disposed (applied), the DA material 15L spreads along the submount electrode 13 and the chip electrode 17. When a load is uniformly applied to the DA material 15L, the DA material 15L can spread to the four corners of the submount electrode 13 substantially equally. In this manner, the submount electrode 13 and the chip electrode 17 are bonded to each other with the DA material 15L interposed therebetween.

Figure 5A:
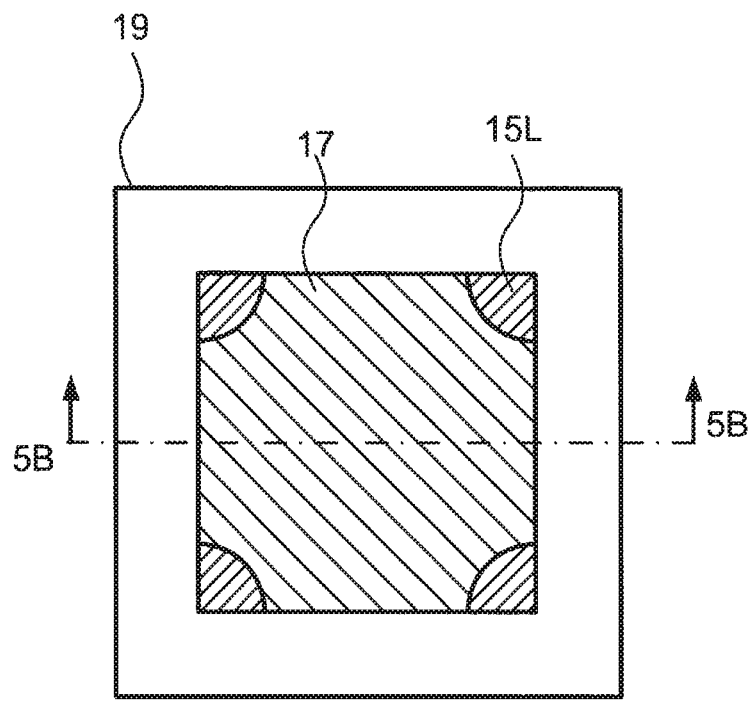
FIG. 5A is a top view illustrating an example of the production process of the optical semiconductor element according to the first exemplary embodiment.
Figure 5B:
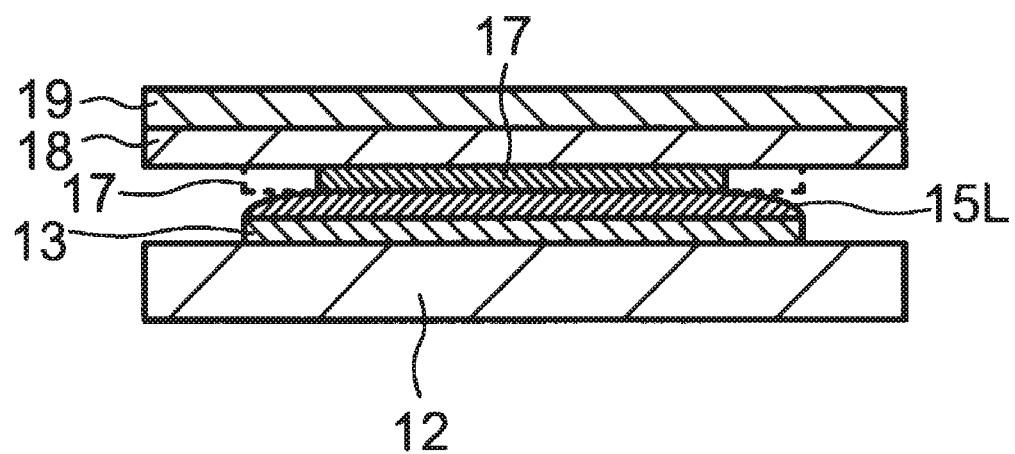
FIG. 5B is a cross-sectional view of the optical semiconductor element according to the first exemplary embodiment.

FIG. 5A is a top view of the chip electrode 17 bonded to the submount electrode 13. FIG. 5B is a cross-sectional view taken along line 5B-5B of FIG. 5A. After the bonding, it is determined whether or not the DA material 15L has spread to the four corners of the submount electrode 13. Specifically, it is determined whether or not the DA material 15L extends to the exposed surfaces 13S where the submount electrode 13 is exposed from the chip electrode 17.

At the time of the determination, those in which the DA material 15L extends to all the exposed surfaces 13S at the four corners are regarded as an acceptable product. If the DA material 15L does not extend at any one or more of the four exposed surfaces 13S in the four corners, it shall be rejected.

For example, the determination is performed by visual confirmation. When the semiconductor structure layer 19 and the element substrate 18 have a light-transmitting property with respect to visible light as in the present exemplary embodiment, it is possible to confirm whether or not the DA material 15L extends to the exposed surfaces 13S through the semiconductor structure layer 19 and the element substrate 18, as illustrated in FIG. 5A.

In this case, the determination may be performed by a method other than visual confirmation. For example, whether or not the DA material 15L extends to the exposed surfaces 13S may be determined by using light in a wavelength region other than visible light as inspection light. In this case, the semiconductor structure layer 19 and the element substrate 18 may have a light-transmitting property with respect to the inspection light. Thereafter, the passing product (accepted product) is delivered to a reflow oven to be cured therein to produce the optical semiconductor element 11 having the bonding layer 15.

It can be said that the accepted product is configured such that the DA material 15L spreads more evenly between the submount electrode 13 and the chip electrode 17 with a more uniform thickness without unevenness. Therefore, in the accepted product, generation of voids or the like is suppressed as well as generation of an unbonded portion between the submount electrode 13 and the chip electrode 17 is suppressed. In addition, it can be said that the flatness of the DA material 15L is secured for the acceptable product.

Figure 6A:
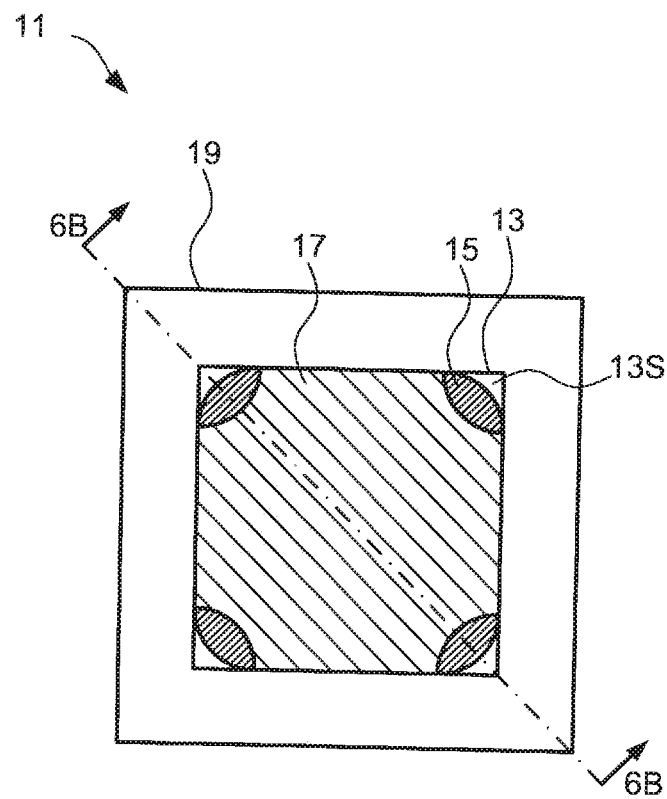
FIG. 6A is a top view illustrating a modification of the optical semiconductor element according to the first exemplary embodiment.
Figure 6B:
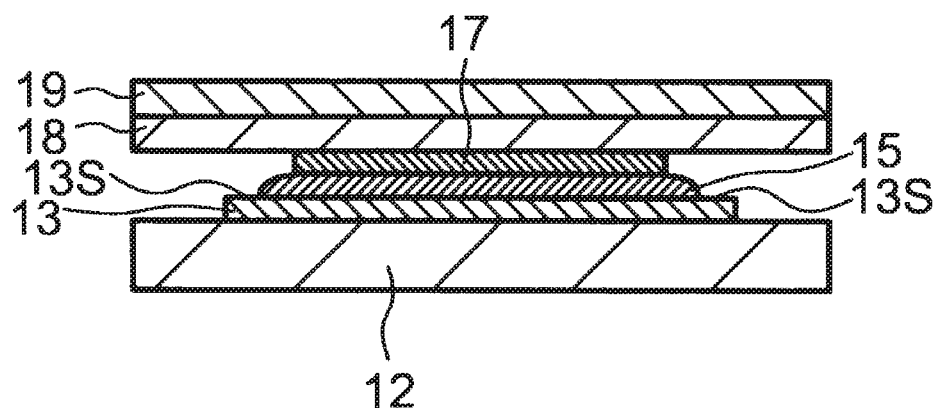
FIG. 6B is a cross-sectional view of the modification of the optical semiconductor element according to the first exemplary embodiment.

Referring to FIGS. 6A and 6B, a modification of the optical semiconductor element 11 in which the bonding layer 15 extends to the exposed surfaces 13S of the submount electrode 13 will be described. FIG. 6A is a top view of the optical semiconductor element 11 and FIG. 6B is a cross-sectional view taken along line 6B-6B of FIG. 6A.

In FIG. 6A, the bonding layer 15 covers a part of the exposed surfaces 13S, The other portion of the exposed surfaces 13S is exposed from the bonding layer 15. Referring to FIG. 6B, the bonding layer 15 extends between the chip electrode 17 and the submount electrode 13, and further extends toward the end portion of the submount electrode 13 on the exposed surfaces 13S, but does not reach the end portion of the submount electrode 13.

In this manner, the bonding layer 15 may partially extend to the respective exposed surfaces 13S at all of the four corners. More specifically, in the optical semiconductor element 11, the bonding layer 15 should extend to all four corners regardless of whether it extends over the entire exposed surfaces 13S or partially.

Thus, the bonding layer 15 may extend entirely on the exposed surfaces 13S of some of the four corners and partially on the remaining exposed surface(s) 13S. In the illustrated example, the bonding layer 15 extends entirely over all of the exposed surfaces 13S at the four corners, but it is more preferable that the bonding layer 15 extends partially over the respective exposed surfaces 13S at the four corners.

Further, in the case of partially extending, the degree of extension of the bonding layer, that is, the amount of protrusion of the bonding layer 15 from the chip electrode 17 is preferably equal for all four corners. That is, it is preferable that the bonding layer 15 uniformly extend to all of the exposed surfaces 13S at the four corners.

Incidentally, the degree of spreadability of the DA material 15L to the exposed surfaces 13S differs also depending on properties such as surface tension and viscosity of a material used as the DA material 15L at the time of manufacturing the material. It is preferable to determine an allowable mode of the bonding layer 15 extending to the exposed surfaces 13S in consideration of the properties.

As described above, the optical semiconductor element 11 of the light-emitting device 10 of the present exemplary embodiment has a configuration in which the rectangular submount electrode 13 and the chip electrode 17 of the semiconductor chip 20 are bonded to each other via the bonding layer 15. The chip electrode 17 has a shape that coincides with the submount electrode 13 except for the four corners of the submount electrode 13, and has chipped corner portions corresponding to the four corners.

The submount electrode 13 has exposed surfaces 13S, which are each a portion exposed from the chip electrode 17, at the four corners. The bonding layer 15 extends to all the exposed surfaces 13S at the four corners. Therefore, the submount electrode 13 and the chip electrode 17 are bonded to each other in a state in which generation of voids and uneven spreading are suppressed by the bonding layer 15 without generating unbonded portions. Therefore, the current density of current flowing through the submount electrode 13 and the chip electrode 17 becomes more uniform. In addition, heat conduction by the submount 12 is less hindered by an unbonded portion such as a void, and heat dissipation efficiency becomes high. Therefore, a long-life optical semiconductor element 11 in which the rate of decrease in luminous efficiency is suppressed as well as the light-emitting device 10 using the same can be provided.

In addition, by the configuration in which the bonding layer 15 extends to all the exposed surfaces 13S at the four corners, the flatness of the bonding layer 15 can be ensured, and the semiconductor chip 20 can be mounted on the submount 12 in parallel with high accuracy. Therefore, the emitted light can be extracted as intended design for the light-emitting device 10, and a target light emission output can be obtained. As described above, according to the present exemplary embodiment, it is possible to provide an optical semiconductor element in which the unbonded portion between the optical semiconductor chip and the submount is made small, the heat dissipation efficiency is high, and the service lifetime can be made long.

Modification

Figure 6C:
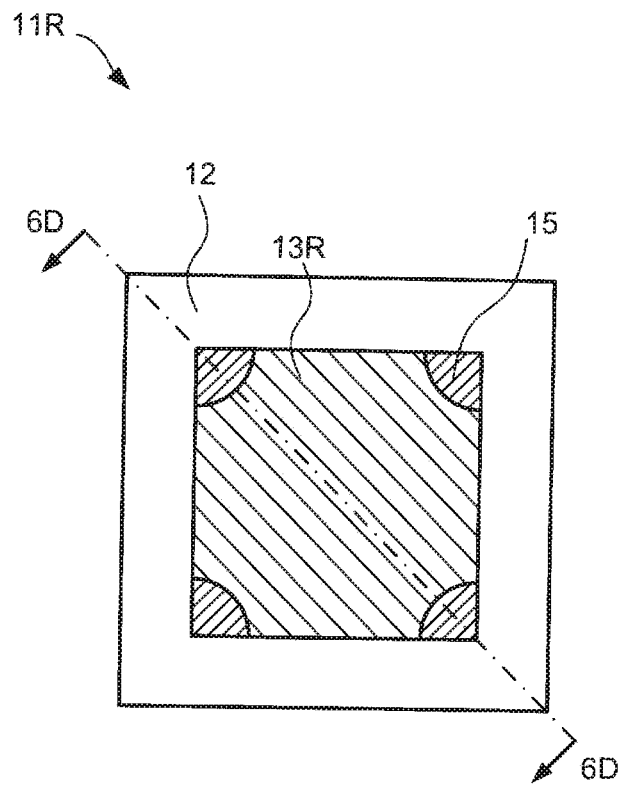
FIG. 6C is a bottom view illustrating a modification of the optical semiconductor element according to the first exemplary embodiment.
Figure 6D:
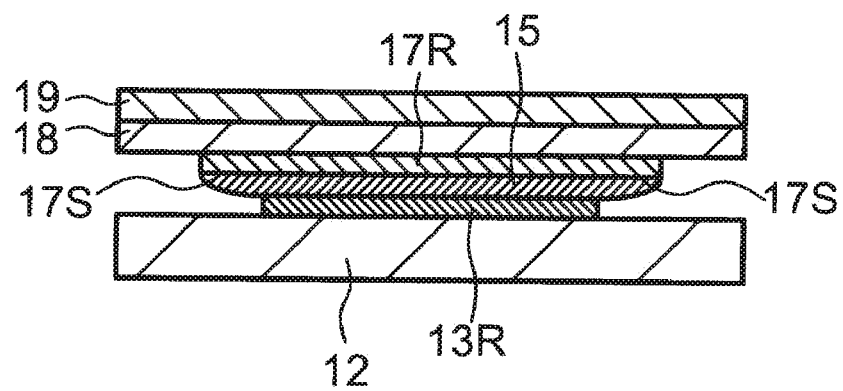
FIG. 6D is a cross-sectional view of the modification of the optical semiconductor element according to the first exemplary embodiment.

FIG. 6C is a bottom view of an optical semiconductor element 11R according to a modification of the present exemplary embodiment. FIG. 6D is a cross-sectional view taken along line 6D-6D of FIG. 6C and shows the submount 12 as the lowermost layer.

The optical semiconductor element 11R has a configuration different from that of the optical semiconductor element 11 with regard to the chip electrode 17, the bonding layer 15, and the submount electrode 13, and the remaining points are configured in the same manner.

The optical semiconductor element 11R has a chip electrode 17R having a rectangular shape as a whole, and a submount electrode 13R having a shape that coincides with the chip electrode 17R except for the four corners of the chip electrode 17R and has chipped corner portions corresponding to the four corners. The bonding layer 15 extends to the exposed surface 17S where the chip electrode 17R is exposed from the submount electrode 13R.

In this case, the submount 12 is a substrate having a light-transmitting property with respect to the inspection light. On the other hand, the element substrate 18 does not need to have a light-transmitting property with respect to the inspection light.

According to this configuration, it is possible to determine whether or not the bonding layer 15 extends to all the exposed surfaces 17S from the submount 12 side. Therefore, as in the case of the optical semiconductor element 11, it is possible to suppress the generation of an unbonded portion such as a void.

Second Exemplary Embodiment

The configuration of a light-emitting device 30 according to the present exemplary embodiment will be described with reference to FIGS. 7 and 8. In the drawings of the present exemplary embodiment, the same reference numerals are assigned to substantially the same or corresponding parts as those in the first exemplary embodiment, and descriptions thereof will be omitted.

The light-emitting device 30 includes an optical semiconductor element 31 of the present invention. FIG. 7 is a top view illustrating the configuration of the light-emitting device 30. FIG. 8 is a cross-sectional view of the light-emitting device 30 taken along line 8-8 in FIG. 7. First, the configuration of the optical semiconductor element 31 will be described.

The submount 12 is a plate-shaped substrate having a mounting surface, and is connected to an external circuit of the optical semiconductor element 31, as in the case of the first exemplary embodiment. As illustrated in FIG. 8, the submount electrode 33 is an electrode pattern formed on the mounting surface of the submount 12, and is made of a metal such as Ti, Pt, Au, Pd, Cr, Ni, Cu, W, or Al. The submount electrode 33 has two submount electrode pieces 33A1 and 33A2.

Figure 7:
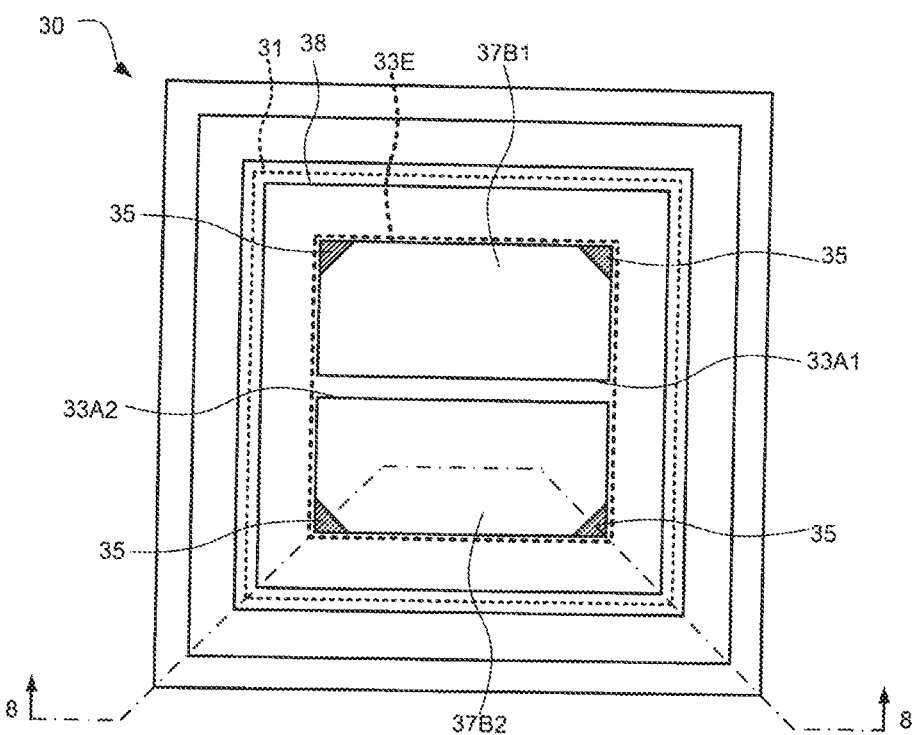
FIG. 7 is a top view of a light-emitting device according to a second exemplary embodiment.
Figure 8:
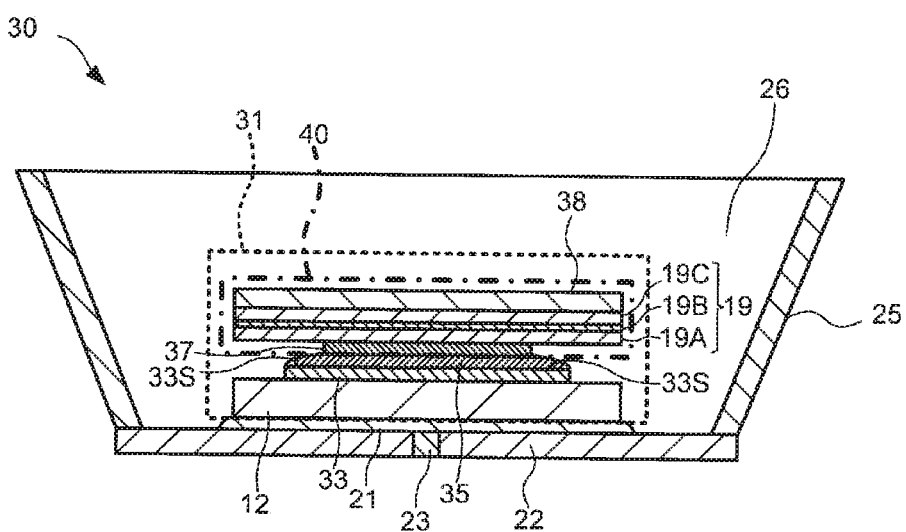
FIG. 8 is a cross-sectional view of the light-emitting device according to the second exemplary embodiment.

As illustrated in FIG. 7, the submount electrode pieces 33A1 and 33A2 each have a rectangular shape and are disposed apart from each other. An outer edge 33E of the submount electrode 33 is defined by a straight line connecting portions of the outer peripheries of the disposed submount electrode pieces 33A1 and 33A2 corresponding to the entire outer peripheries (meaning that the portions except for the opposed inner peripheries), and thus has a rectangular shape. That is, as a result, the submount electrode 33 has a rectangular shape as a whole.

The bonding layer 35 is a conductive bonding material formed on the submount electrode 33. As the bonding layer 35, a conductive paste, a solder material, or the like material having the same conductivity as that of the bonding layer 15 of the first exemplary embodiment can be used. In this exemplary embodiment, an example in which AuSn is adopted as the bonding layer 35 will be described. The bonding layer 35 is formed on each of the submount electrode piece 33A1 and the submount electrode piece 33A2.

The chip electrode 37 is an electrode pattern provided on the bonding layer 35. The chip electrode 37 is bonded to the submount electrode 33 via the bonding layer 35. The chip electrode 37 has two chip electrode pieces 37B1 and 37B2. The chip electrode pieces 37B1 and 37B2 each have a shape and arrangement that coincide with the respective submount electrode pieces 33A1 and 33A2 except for the four corners of the submount electrode 33, that is, the four corners of the outer edge 33E of the submount electrode 33, and the corners corresponding to the four corners of the submount electrode 33 are lacking. The two submount electrode pieces 33A1 and 33A2 and the two chip electrode pieces 37B1 and 37B2 are bonded to each other while coinciding with each other, except for the four corners.

The two submount electrode pieces 33A1 and 33A2 have exposed surfaces 33S at four corners of the submount electrode 33, that is, at four corners corresponding to the four corners of the outer edge 33E. As illustrated in FIG. 7, the bonding layer 35 extends to all of the four exposed surfaces 33S. For example, as illustrated in FIG. 8, the bonding layer 35 extends so as to cover the entire two exposed surfaces 33S of the surmount electrode piece 33A2.

The semiconductor structure layer 19 is provided on the chip electrode 37. That is, the chip electrode 37 is an electrode pattern formed on the semiconductor structure layer 19. The semiconductor structure layer 19 includes the p-type semiconductor layer 19A, the active layer 19B (or light-emitting layer), and the n-type semiconductor layer 19C which are stacked in this order and disposed on the chip electrode 37. As described above, light having a wavelength corresponding to the material and composition of the semiconductor structure layer 19 is emitted from the light-emitting layer 19B.

The element substrate 38 is provided on the semiconductor structure layer 19. The element substrate 38 is a growth substrate of the semiconductor structure layer 19. The element substrate 38 is a substrate having a light-transmitting property with respect to visible light and formed of such as sapphire, SiC, AlN, or the like. This exemplary embodiment shows an example in which an AlN single crystal substrate is adopted as the element substrate 38. As illustrated in FIG. 8, the chip electrode 37, the semiconductor structure layer 19, and the element substrate 38 constitute a semiconductor chip 40.

The optical semiconductor element 31 is mounted on the package substrate 22 via the power supply adhesive 21 in the same manner as that in the first exemplary embodiment. The power supply pad 23 is a connection electrode provided on the mounting surface of the package substrate 22 and connected to an external circuit. As in the case of the first exemplary embodiment, the reflector 25 is provided on the package substrate 22, and the optical semiconductor element 31 is accommodated in the cavity 26 and thus packaged.

In this exemplary embodiment, an example is shown in which the optical semiconductor element 31 is a flip-chip type LED element where the semiconductor chip 40 with the semiconductor structure layer 19 grown on the element substrate 38 is reversely mounted.

As described above, the chip electrode 37 is divided into the chip electrode pieces 37B1 and 37B2. Therefore, one of the chip electrode pieces 37B1 and 37B2 can be electrically connected to the p-type semiconductor layer 19A, and the other thereof can be electrically connected to the n-type semiconductor layer 19C.

For example, the power supply pad 23 is provided so as to have two series of connection electrodes one of which is electrically connected to the chip electrode piece 37B1 and the submount electrode piece 33A1 bonded thereto, and the other of which is electrically connected to the chip electrode piece 37B2 and the submount electrode piece 33A2 bonded thereto, and thus it is possible to supply the flip-chip type optical semiconductor element with power.

As described above, according to the present exemplary embodiment, even when each of the submount electrode 33 and the chip electrode 37 has two electrode pieces, the chip electrode 37 can have the exposed surfaces 33S at the four corners of the outer edge 33E of the submount electrode 33.

The bonding layer 35 extends to the exposed surfaces 33S, whereby the optical semiconductor element 31 in which voids are less generated can be provided. Accordingly, the optical semiconductor element driven with a uniform current density and having a good heat dissipation efficiency and a long lifetime as well as the light-emitting device using the same can be provided.

Further, the parallelism with respect to the submount 12 when mounting the semiconductor chip 40 can be ensured, and thus h optical semiconductor element which can obtain light distribution characteristics and light emission output as designed, and the light-emitting device using the same can be provided.

Figure 9:
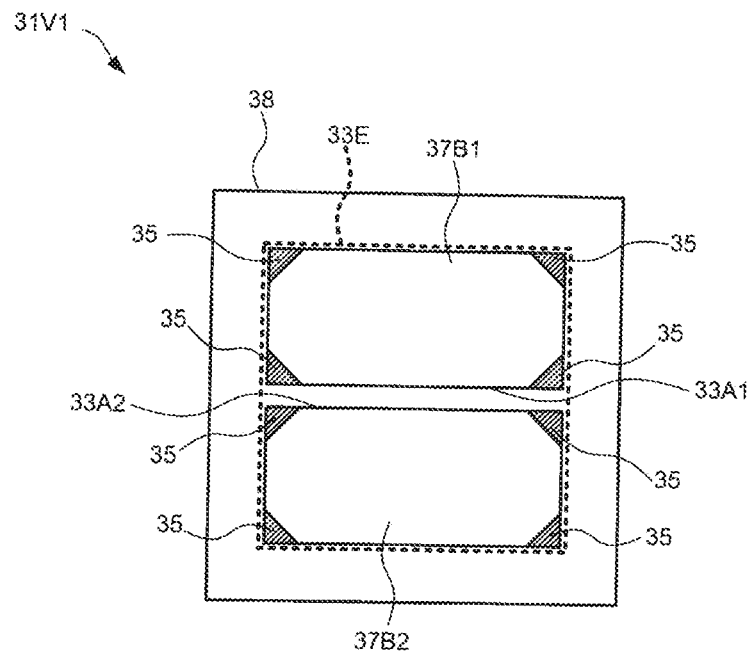
FIG. 9 is a top view illustrating a modification of the optical semiconductor element according to the second exemplary embodiment.

FIG. 9 is a top view of an optical semiconductor element 31V1 which is a modification of the optical semiconductor element 31 of the present exemplary embodiment. As illustrated in FIG. 9, the submount electrode 33 has two submount electrode pieces 33A1 and 33A2.

The chip electrode 37 has two chip electrode pieces 37B1 and 37B2 that have a shape and arrangement that coincides with the corresponding submount electrode pieces 33A1 and 33A2 except for the four corners of each of the two submount electrode pieces, and have chipped corners corresponding to the four corners of each of the two submount electrode pieces. The two submount electrode pieces 33A1 and 33A2 have exposed surfaces 33S at the respective four corners, and the bonding layer 35 extends to all of the exposed surfaces 33S at the respective four corners.

The optical semiconductor element 31V1 can be configured such that the bonding layer 35 between the submount electrode piece 33A1 and the chip electrode 37B1 and the bonding layer 35 between the submount electrode piece 33A2 and the chip electrode 37B2 can be formed so that the generation of an unbonded portion such as a void can be more reliably inhibited in the respective bonding layers 35.

Third Exemplary Embodiment

Figure 10:
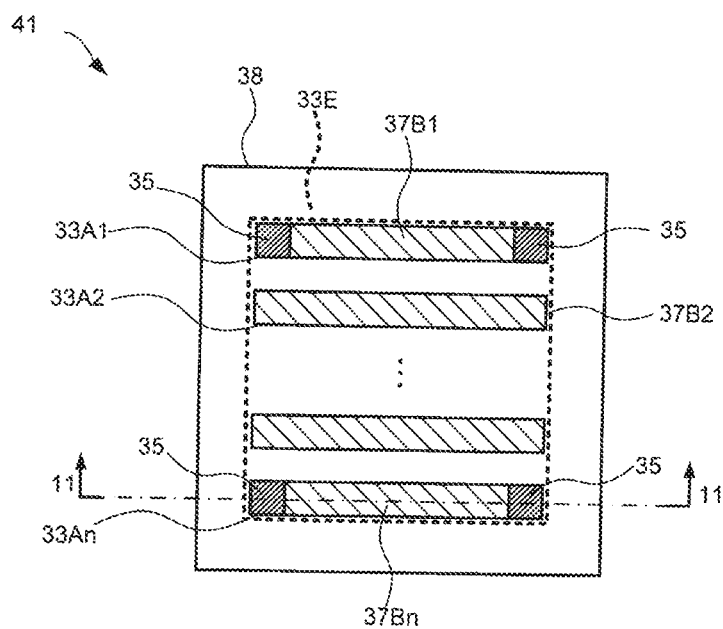
FIG. 10 is a top view illustrating an optical semiconductor element according to a third exemplary embodiment.
Figure 11:
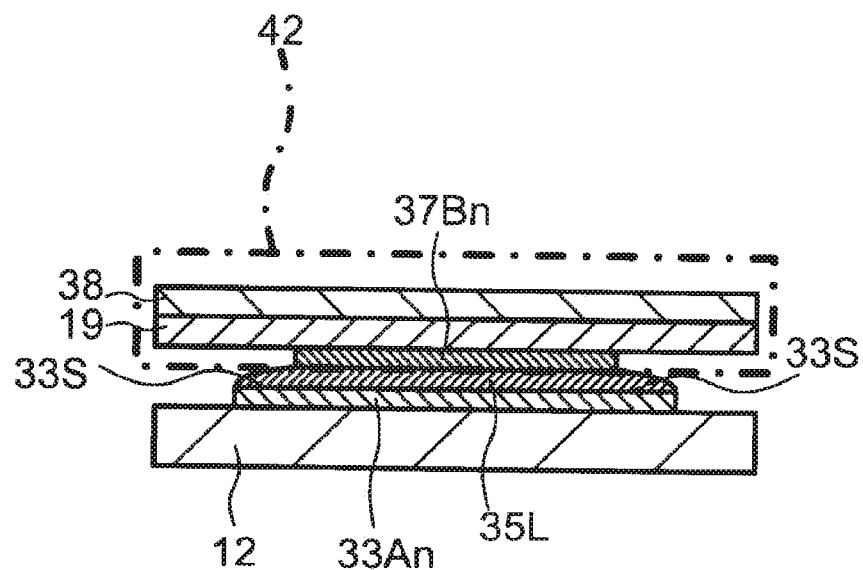
FIG. 11 is a cross-sectional view illustrating the optical semiconductor element according to the third exemplary embodiment.

A light-emitting device of a third exemplary embodiment will be described with reference to FIGS. 10 to 12B. In the present exemplary embodiment, an optical semiconductor element 41 is mounted on the package substrate 22 in the same manner as in the second exemplary embodiment. Hereinafter, the configuration of the optical semiconductor element 41 will be described. FIG. 10 is a top view of the optical semiconductor element 41, and FIG. 11 is a cross-sectional view taken along line 11-11 of FIG. 10.

As illustrated in FIG. 10, the submount electrode 33 has first to n-th (n≥2) submount electrode pieces 33A1 to 33An (hereinafter, also referred to simply as "submount electrode pieces"). Each of the submount electrode pieces 33A1 to 33An has a stripe shape (strip piece) and is arranged apart from each other. More specifically, each of the submount electrode pieces is disposed while being aligned parallel to each other.

As illustrated in FIG. 10, the outer edge 33E of the submount electrode 33 is defined by a straight line connecting portions of the outer peripheries of the disposed submount electrode pieces 33A1 to 33An corresponding to the entire outer peripheries, and has a rectangular shape. That is, as a result, the submount electrode 33 has a rectangular shape as a whole.

The bonding layer 35 is a conductive bonding material formed on the submount electrode 33. As the bonding layer 35, a conductive material such as a conductive paste or a solder material can be used. In this exemplary embodiment, an example in which AuSn is adopted as the bonding layer 35 will be described.

The bonding layer 35 is formed along each of the submount electrode pieces 33A1 to 33An. As illustrated in FIG.

11, the bonding layer 35 extends to both ends of the submount electrode (electrode piece) 33An.

The chip electrode 37 is an electrode pattern provided on the bonding layer 35. The chip electrode 37 is bonded to the submount electrode 33 via the bonding layer 35. The chip electrode 37 is composed of first to n-th chip electrode pieces 37B1 to 37Bn (hereinafter, also referred to simply as "chip electrode pieces"). For the sake of clarity, the chip electrode pieces and the bonding layer 35 are densely hatched in FIG. 10.

As illustrated in FIG. 10, the chip electrode pieces 37B1 to 37Bn each have a shape and arrangement that coincide with the respective submount electrode pieces (33A1 to 33An) except for the four corners of the submount electrode 33 at the outer edge 33E, and thus, both ends of the first and n-th submount electrode pieces 37B1 and 37Bn are lacking.

Except for the four corners, each of the submount electrode pieces and each of the chip electrode pieces are bonded via the bonding layer 35 each other while coinciding with each other. Each of the first and n-th submount electrode pieces has exposed surfaces 33S which is a portion exposed from the chip electrode at both ends thereof, and the bonding layer 35 extends to all the exposed surfaces 33S.

The semiconductor structure layer 19 and the element substrate 38 are configured in the same manner as that in the second exemplary embodiment. The chip electrode 37, the semiconductor structure layer 19, and the element substrate 38 constitute a semiconductor chip 42.

Figure 12A:
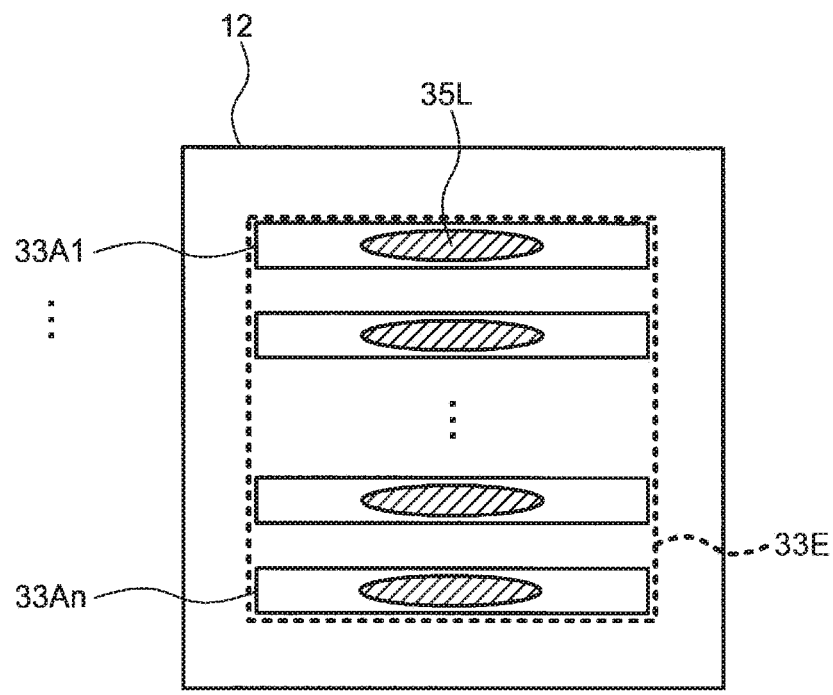
FIG. 12A is a top view illustrating an example of a production process of the optical semiconductor element according to the third exemplary embodiment.

An example of a method for producing an optical semiconductor element 41 will be described with reference to FIGS. 12A and 12B. FIG. 12A is a top view illustrating the submount 12, the submount electrode 33, and the die attach material (DA material) 35L disposed on the submount electrode 33. The material for the DA material 35L is similar to the DA material 15L that forms the bonding layer 35 of the optical semiconductor element 31, and is preferably a material that is conductive and has fluidity at the time of production. Thus, for example, AuSn is preferably adopted.

As illustrated in FIG. 12A, the DA material 35L is disposed at the center of each of the submount electrode pieces 33A1 to 33An of the submount electrode 33. For example, the DA material 35L is disposed around a position as a center where distances from both ends of each of the submount electrode pieces having a stripe shape are equal to each other. The DA material 35L disposed in this manner is less likely entrain air when the DA material 35L spreads, whereby an unbonded portion such as a void is hardly generated in the bonding layer 35.

Figure 12B:
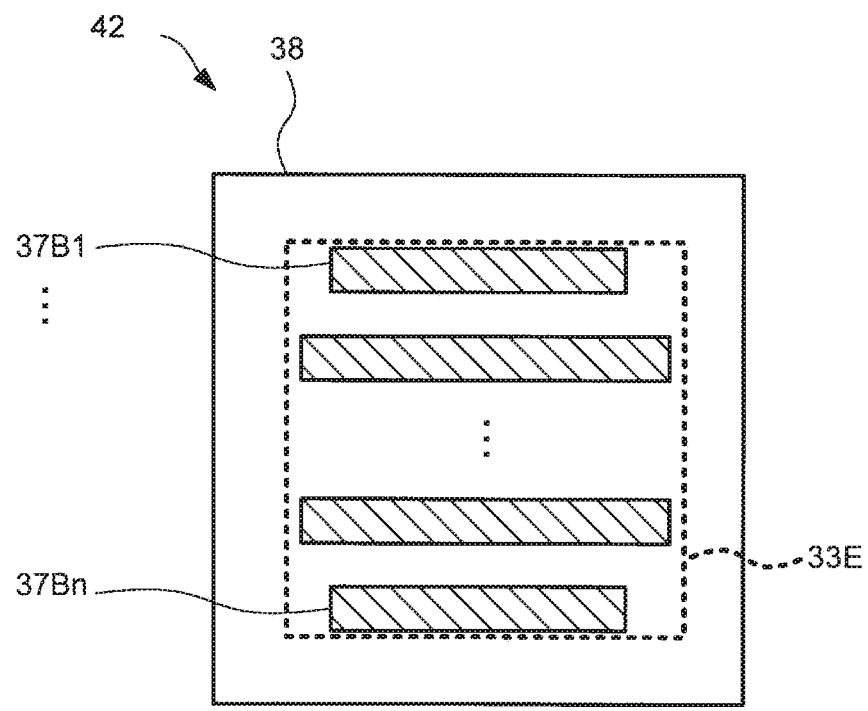
FIG. 12B is a top view illustrating an example of the production process of the optical semiconductor element according to the third exemplary embodiment.

FIG. 12B is a top view of the semiconductor chip 42. As illustrated in FIG. 12B, the chip electrode 37 is formed as an electrode pattern having the chip electrode pieces 37B1 to 37Bn. Each of the chip electrode pieces 37B1 to 37Bn is formed in a shape and arrangement that coincide with the submount electrode 33, as described above, when it is bonded to the submount electrode 33. For the purpose of explanation, FIG. 12B shows a shape and a position corresponding to the outer edge 33E of the submount electrode 33.

The semiconductor chip 42 is placed on the submount electrode 33, on which the DA material 35L has been disposed, in a direction in which the chip electrode 37 is brought into contact with the DA material 35L. At this time, it is preferable that each of the submount electrode pieces 33A1 to 33An and each of the corresponding chip electrode pieces 37B1 to 37Bn are correspondingly aligned and mounted so as to be bonded together, except for both ends of each of the submount electrode pieces while coinciding with each other.

After the semiconductor chip 42 has been placed thereon, a load is applied to a position corresponding to the center of the outer edge 33E of the submount electrode 33. When such a load is applied, the DA material 35L, spreads along each of the submount electrode pieces and each of the chip electrode pieces.

After the load has been applied to the semiconductor chip 42, it is determined whether or not the DA material 35L extends to all the exposed surfaces 33S. For example, the determination is performed by visual confirmation. The determination may be performed by, for example, an inspection apparatus using inspection light in a wavelength region that is transparent to the element substrate 38 and the semiconductor structure layer 19.

In this determination, the DA material 35L extending to all of the exposed surfaces 33S of the submount electrode pieces 33A1 and 33An passes the determination, meaning that the product passes the quality inspection. If the DA material 35L does not extend at any one or more of the exposed surfaces 33S, it shall be rejected.

However, a more detailed criterion may be provided. For example, a product may be determined as an accepted product when the DA material 35L extends over the whole exposed surfaces in each of all the exposed surfaces 33S. In any one or more of the exposed surfaces 33S, when the DA material 35L extends only to a part of the exposed surface 33S, such a product may be determined as an unaccepted product. Further, the determination may be made on the basis of whether or not the extent to which the DA material 35L extends over the exposed surface 33S is uniform among all the exposed surfaces 33S.

Thereafter, the accepted product is heated in a reflow furnace, so that the DA material 35L is cured to form the bonding layer 35, thereby completing the optical semiconductor element 31. Thus, the accepted product is configured such that the DA material 35L spreads more evenly between the submount electrode 33 and the chip electrode 37 with a more uniform thickness, and the generation of an unbonded portion between the submount electrode 33 and the chip electrode 37, such as a void, is suppressed. Further, it can be said that the flatness of the DA material 35L can be ensured for the accepted product.

As described above, according to the present exemplary embodiment, even when each of the submount electrode 33 and the chip electrode 37 has a plurality of electrode pieces, the chip electrode 37 can have the exposed surface 33S at the four corners of the submount electrode 33.

More specifically, except for the four corners of the outer edge 33E of the submount electrode 33 having the submount electrode pieces 33A1 to 33An having a stripe shape, the first to n-th chip electrode pieces each having a shape and arrangement that coincide with the corresponding submount electrode pieces and chipped ends corresponding to both ends of the first and the n-th submount electrode pieces can be provided.

The bonding layer 35 extends to the exposed surfaces 33S at both ends of the first and the n-th submount electrode pieces, whereby the optical semiconductor element 41 in which generation of an unbonded portion such as a void or the like is suppressed can be provided. Accordingly, the optical semiconductor element driven with a uniform current density and having a good heat dissipation efficiency and a long lifetime as well as the light-emitting device using the same can be provided.

Further, the parallelism with respect to the submount 12 when mounting the semiconductor chip 40 can be ensured, and thus the optical semiconductor element which can obtain light distribution characteristics and light emission output according to the intended design, and the light-emitting device using the same can be provided.

Fourth Exemplary Embodiment

A light-emitting device of a fourth exemplary embodiment will be described with reference to FIGS. 13 to 14B. In the present exemplary embodiment, an optical semiconductor element 43 is mounted on the package substrate 22 in the same manner as in the second and third exemplary embodiments. The optical semiconductor element 43 is configured in the same manner as in the optical semiconductor element 41 of the third exemplary embodiment except for the configuration of the chip electrode pieces 37B1 to 37Bn. Hereinafter, the configuration of the optical semiconductor element 43 will be described.

Figure 13:
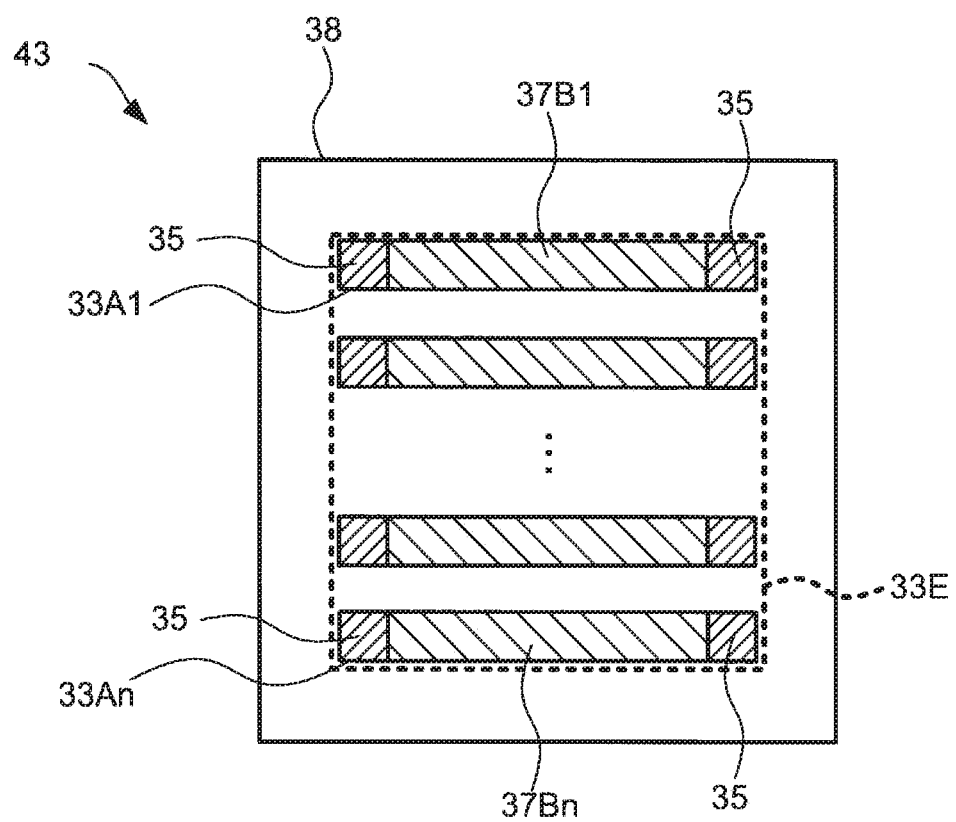
FIG. 13 is a top view illustrating an optical semiconductor element according to a fourth exemplary embodiment.

FIG. 13 is a top view of the optical semiconductor element 43. The submount electrodes 33 has submount electrode pieces 33A1 to 33An each having a stripe shape and arranged apart from each other in the same manner as in the third exemplary embodiment. The bonding layer 35 is formed along each of the submount electrode pieces 33A1 to 33An. The chip electrode 37 is bonded to the submount electrode 33 via the bonding layer 35, and includes chip electrode pieces 37B1 to 37Bn.

As illustrated in FIG. 13, the chip electrode pieces 37B1 to 37Bn each have a shape and arrangement that coincide with the respective submount electrode pieces except for both ends of each of the submount electrodes 33A1 to 33An, and thus, both ends corresponding to both ends of the corresponding submount electrode pieces are lacking. That is, the chip electrode pieces other than the first and n-th chip electrode pieces 37B1 and 37Bn also include chipped end portions corresponding to both end portions of the corresponding submount electrode pieces.

Except for the both ends, each of the submount electrode pieces 33A1 to 33An and each of the chip electrode pieces 37B1 to 37Bn are bonded via a bonding layer 35 while coinciding with each other. Each of the submount electrode pieces has an exposed surface 33S, which is a portion exposed from the chip electrode at either end, and the bonding layer 35 extends to all the exposed surfaces 33S.

In this manner, each of the chip electrode pieces lacks end portions corresponding to both ends of each of the submount electrode pieces, and each of the submount electrode pieces can have an exposed surface 33S at respective ends. Accordingly, it is possible to provide the optical semiconductor element 43 in which the generation of an unbonded portion such as a void in the bonding layer 35 between each of the submount electrode pieces and each of the corresponding chip electrode pieces is suppressed.

In the optical semiconductor element 43, the bonding layer 35 only needs to extend over all four corners of the submount electrode 33 regardless of whether it extends over the entire exposed surface 33S entirely or partially. In addition, regarding the exposed surface 33S at both ends of each of all the submount electrode pieces having the stripe shape, the bonding layer 35 only needs to extend regardless of whether it extends over the entire exposed surface 33S entirely or partially.

Accordingly, the bonding layer 35 may extend entirely on the exposed surfaces 33S of some of the opposite ends of each of all the submount electrode pieces, and partially on the remaining exposed surface 33S. It should be noted that it is more preferable that the bonding layer 35 entirely extends all of the exposed surfaces 33S, or partially extend all of the exposed surfaces 33S.

Figure 14A:
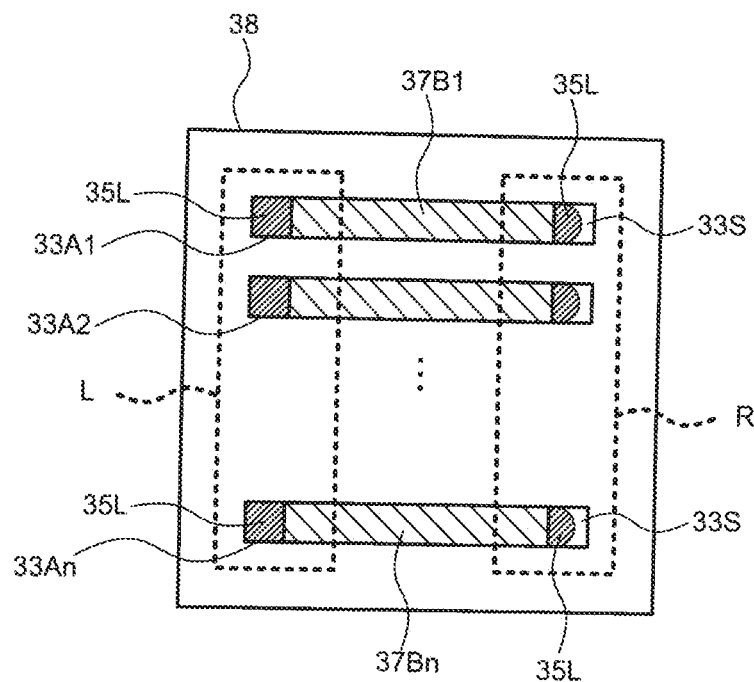
FIG. 14A is a top view illustrating the optical semiconductor element according to the fourth exemplary embodiment.
Figure 14B:
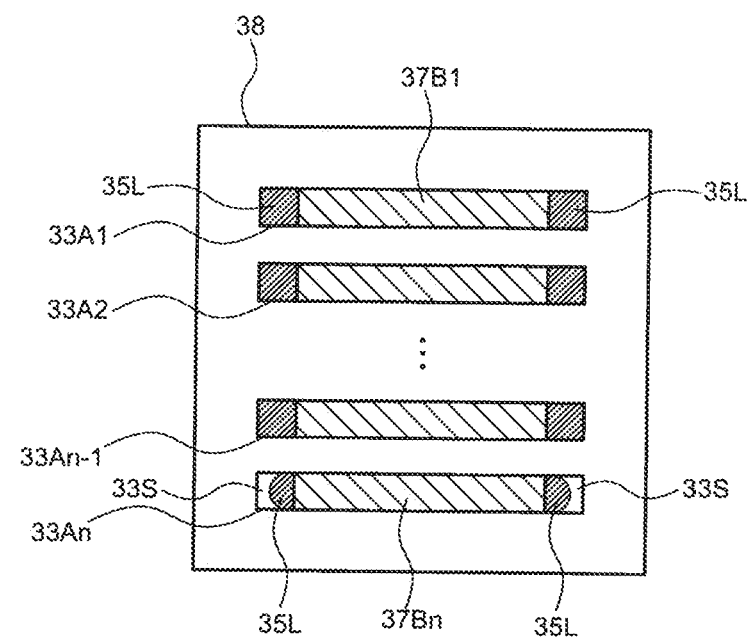
FIG. 14B is a top view illustrating the optical semiconductor element according to the fourth exemplary embodiment.

With reference to FIGS. 14A and 14B, the determination of whether or not the DA material 35L extends to all the exposed surfaces 33S at the time of producing the optical semiconductor element 43 will be described. FIG. 14A is a top view illustrating an example of a state in which the chip electrode 37 is bonded onto the submount electrode 33 with the DA material 35L interposed therebetween.

In FIG. 14A, the DA material 35L extends to the exposed surfaces 33S, which are portions exposed from the chip electrodes 37B1 to 37Bn at both ends of all of the submount electrode pieces 33A1 to 33An. That is, the DA material 35L extends to the exposed surfaces 33S at all of the four corners of the submount electrode 33. Therefore, in this case, such a product is accepted in principle in the determination at the time of production.

However, in FIG. 14A, the DA material 35L extends over the entire exposed surfaces 33S at the end portions on one side (in FIG. 14A, a portion L surrounded by a broken line) out of the both end portions of the respective submount electrode pieces. The DA material 35L extends to partial regions of the exposed surfaces 33S at end portions (a portion surrounded by a broken line in FIG. 14A) on the other side of the respective submount electrode pieces, and the exposed surfaces 33S are exposed from the DA material 35L in the other region.

In this manner, when the exposed surfaces 33S are unevenly provided due to the extent that the DA material 35L extends, that is, when the amount of the DA material 35L protruding from the chip electrode 37 is uneven, the chip electrode 37 may be considered to be bonded to the submount electrode 33 with an inclination in the long side direction of the stripe shape of the submount electrode, as compared with the case where the amount of the protruding is uniform. Therefore, it is considered that the spread of the DA material 35L is not uniform and voids or the like may be generated. In such a case, a criterion for judging as being failed may be set.

FIG. 14B is a top view illustrating another example of a state in which the chip electrode 37 is bonded onto the submount electrode 33 with the DA material 35L interposed therebetween. In FIG. 14B, the DA material 35L extends to the exposed surfaces 33S at both ends of all of the submount electrode pieces 33A1 to 33An. Therefore, as in the case of FIG. 14A, such a product is accepted in principle in the determination at the time of production.

More specifically, the DA material 35L extends over the entire exposed surface 33S at both ends of the submount electrode pieces 33A1 to 33An−1. On the other hand, at both ends of the n-th submount electrode piece 33An, the DA material 35L extends to a part of the exposed surfaces 33S, and, thus, the exposed surface 33S is partly exposed from the DA material 35L.

Also in this case, the extent to which the DA material 35L extends to the exposed surface 33S is not uniform, and it can be said that the chip electrode 37 is bonded to the submount 12 and the submount electrode 33 in a manner inclined in a direction perpendicular to the long side of the stripe shape. Also in such a case, a criterion for judging as being failed may be set.

Fifth Exemplary Embodiment

Figure 15:
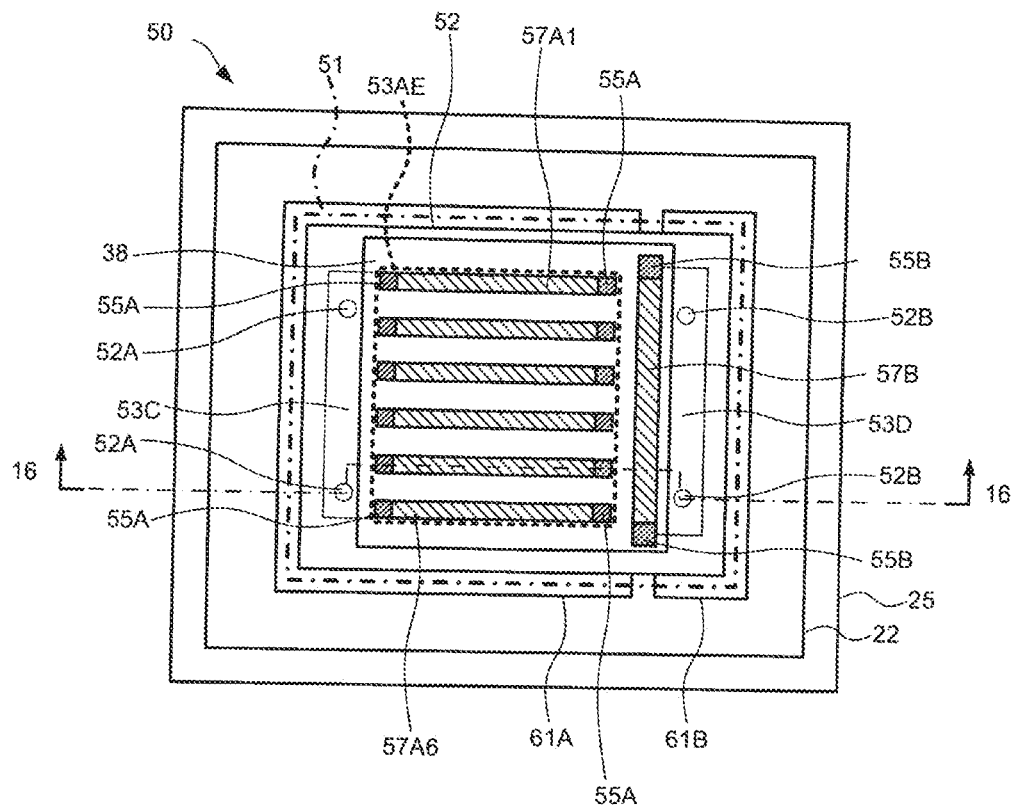
FIG. 15 is a top view of a light-emitting device according to fifth exemplary embodiment.

The configuration of a light-emitting device 50 according to a fifth exemplary embodiment will be described with reference to FIGS. 15 to 18. The light-emitting device 50 includes an optical semiconductor element 51 of the present invention. FIG. 15 is a top view illustrating the configuration of the light-emitting device 50, and FIG. 16 is a cross-sectional view taken along line 16-16 of FIG. 15.

The submount 52 has a mounting surface, and through holes 52A and 52B and wirings 53C and 53D are provided on the mounting surface. The through holes 52A and 52B are plated with metal, for example, or filled with metal, so that electrical continuity is established between the mounting surface and the opposite surface. The wirings 53C and 53D are connected to an external circuit via through holes 52A and 52B.

Figure 16:
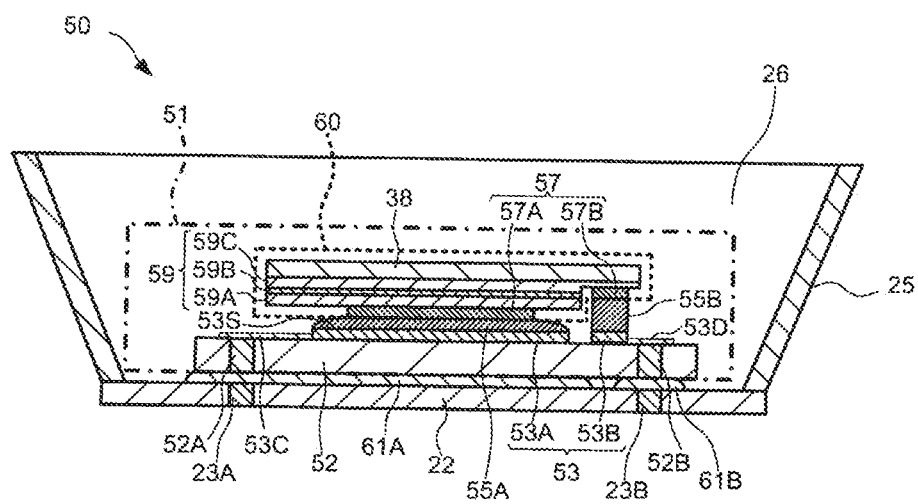
FIG. 16 is a cross-sectional view of the light-emitting device according to the fifth exemplary embodiment.

As illustrated in FIG. 16, the submount electrode 53 is an electrode pattern formed on the mounting surface of the submount 52, and is made of, for example, a metal such as Ti, Pt, Au, or Pd. The submount electrode 53 includes submount electrode pieces 53A and a submount electrode piece 53B as a submount-side opposite electrode.

The submount electrode piece 53A is composed of first to n-th submount electrode pieces where n≥2. In the present exemplary embodiment, the case where n=6 will be described. As illustrated in FIG. 16, thus, the submount electrode pieces 53A includes first to sixth submount electrode pieces 53A1 to 53A6.

As illustrated in FIG. 15, each of the submount electrode pieces 53A1 to 53A6 has a stripe shape, and they are arranged apart from each other. More specifically, the submount electrode pieces 53A1 to 53A6 are disposed in n rows such that the long sides of the stripe shapes are arranged in parallel with each other.

The submount electrode piece 53B has a stripe shape, and is disposed apart from the submount electrode pieces 53A in a direction perpendicular to the long sides of the submount electrode pieces 53A1 to 53A6.

As illustrated in FIG. 15, the outer edge 53AE of the submount electrode 53A is defined by a straight line connecting portions of the outer peripheries of the submount electrode pieces corresponding to the entire outer peripheries of the disposed submount electrode pieces 53A1 to 53A6, and has a rectangular shape. That is, the submount electrode 53A has a rectangular shape as a whole.

The bonding layer 55 includes bonding layers 55A and a bonding layer 55B. The bonding layer 55A is formed along each of the submount electrode pieces 53A1 to 53A6. As illustrated in FIG. 16, the bonding layer 55A extends to both ends of each of the submount electrode pieces 53A. The bonding layer 55B is formed along the submount electrode piece 53B and extends to both ends of the submount electrode piece 53B.

Similar to the above-described exemplary embodiment, a conductive material such as a conductive paste, a solder material, or the like can be used as the material for the bonding layer 55, and an example in which the bonding layer 55 is made of AuSn will be described in this exemplary embodiment.

The chip electrode 57 is an electrode pattern provided on the bonding layer 55, and is bonded to the submount electrode 53 via the bonding layer 55. The chip electrode 57 may be formed by combining metals such as Ti, Al, Au, and Ni, and may be formed by using metals such as Pt, W, Pd, Cr, Ni, and Cu.

The chip electrode 57 includes chip electrode pieces 57A and a chip electrode piece 57B as a chip-side opposite electrode. The chip electrode piece 57A is provided on the bonding layer 55A and includes first to n-th chip electrode pieces where n≥2. In the present exemplary embodiment, the case where n=6 will be described.

As illustrated in FIG. 15, the chip electrode 57A has first to sixth chip electrode pieces 57A1 to 57A6, each having a shape and arrangement that coincide with the corresponding submount electrode piece 53A except for both ends of each of the submount electrode pieces 53A1 to 53A6, and chipped ends corresponding to both ends of each of the submount electrode pieces 53A.

The chip electrode piece 57B is provided on the bonding layer 55B. For example, the chip electrode piece 57B has a shape and arrangement that coincide with the submount electrode piece 53B except for both ends of the submount electrode piece 53B, and has a shape in which ends corresponding to both ends of the submount electrode piece 53B are lacking.

Except for both ends of each of the submount electrode pieces 53A, each of the submount electrode pieces 53A and each of the chip electrode pieces 57A are bonded together with the bonding layer 55A therebetween while coinciding with each other. Except for both ends of the submount electrode piece 53B, the submount electrode piece 53B and the chip electrode piece 57B are bonded with the bonding layer 55B interposed therebetween while coinciding with each other.

Each of the submount electrode pieces 53A and the submount electrode 53B have an exposed surface 53S exposed from each of the chip electrode pieces at both ends of the stripe shape. In this exemplary embodiment, the bonding layer 55A extends to all the exposed surfaces 53S of the submount electrode piece 53A, and the bonding layer 55B extends to two exposed surfaces 53S of the submount electrode piece 53B. That is, the bonding layer 55 extends to all the exposed surfaces 53.

The semiconductor structure layer 59 is disposed on the chip electrode 57. That is, the chip electrode 57 is an electrode pattern formed on the semiconductor structure layer 59. The semiconductor structure layer 59 is formed by stacking a p-type (first conductivity type) semiconductor layer 59A, an active layer (or light-emitting layer) 59B, and an n-type (second conductivity type) semiconductor layer 59C on the chip electrode 57 in this order.

The wavelength of the emitted light from the light-emitting layer 59B is a wavelength corresponding to the material and composition of the semiconductor structure layer 59. In this exemplary embodiment, a case where deep ultraviolet light having a wavelength in the deep ultraviolet region is emitted from the light-emitting layer 59B will be described.

The element substrate 38 is disposed on the semiconductor structure layer 59 and is a substrate such as sapphire, SiC, AlN, or the like having a light-transmitting property with respect to visible light. In this exemplary embodiment, an example in which an AlN single crystal substrate is adopted as the element substrate 38 will be described.

As illustrated in FIG. 16, the element substrate 38, the semiconductor structure layer 59, and the chip electrode 57 constitute a semiconductor chip 60. The optical semiconductor element 51 is a flip-chip type optical semiconductor element in which the semiconductor chip 60 in which a semiconductor structure layer 59 is grown on the element substrate 38 is reversely mounted. In the optical semiconductor element 51, light from the light-emitting layer 59B is emitted from the upper surface of the element substrate 38. That is, the upper surface of the element substrate 38 serves as a light-emitting surface.

The optical semiconductor element 51 is mounted on the package substrate 22 via the power supply adhesives 61A and 61B. The power supply pads 23A and 23B are connection electrodes provided on the mounting surface of the package substrate 22 and connected to an external circuit. A reflector 25 is provided on the package substrate 22, and the optical semiconductor element 51 is accommodated and packaged in the cavity 26.

Figure 17:
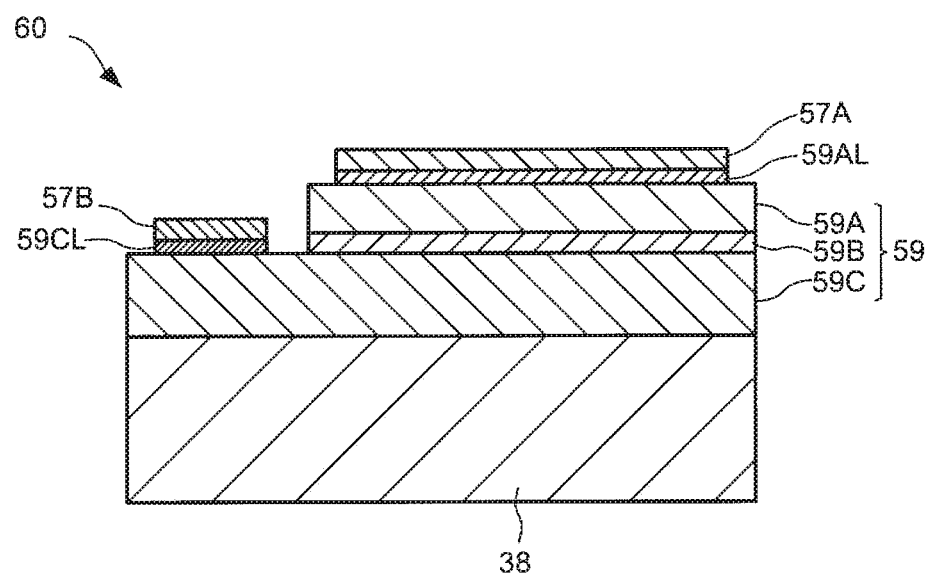
FIG. 17 is a cross-sectional view of a semiconductor chip according to the fifth exemplary embodiment.

FIG. 17 is an enlarged view of the semiconductor chip 60 in FIG. 16 while the chip 60 is vertically inverted. The n-type semiconductor layer 59C, the active layer 59B, and the p-type semiconductor layer 59A are formed on the element substrate 38 in this order.

An n-electrode layer 59CL is formed in a partial region on the n-type semiconductor layer 59C. The chip electrode piece 57B is formed on the n-electrode layer 59CL. That is, the chip electrode piece 57B is electrically connected to the n-type semiconductor layer 59C via the n-electrode layer 59CL.

A p-electrode layer 59AL is formed in a partial region on the p-type semiconductor layer 59A. The chip electrode piece 57A is formed on the p-electrode layer 59AL. That is, the chip electrode piece 57A is electrically connected to the p-type semiconductor layer 59A via the p-electrode layer 59AL. That is, the chip electrode pieces 57A and 57B are pad electrodes in the semiconductor chip 60.

Figure 18:
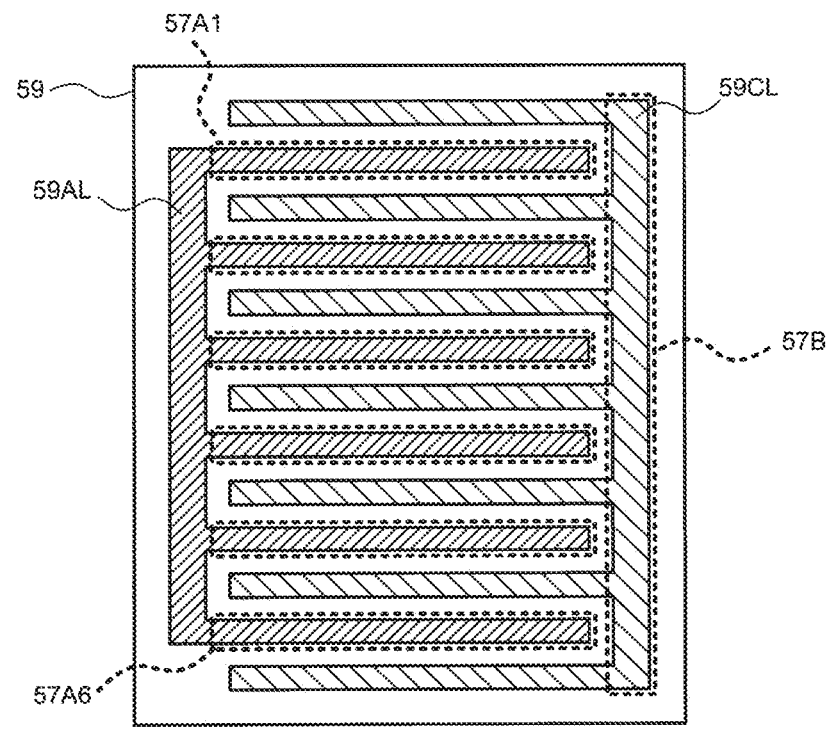
FIG. 18 is a top view of a semiconductor structure layer according to the fifth exemplary embodiment.

FIG. 18 is a top view illustrating the p-electrode layer 59AL and the n-electrode layer 59CL of the semiconductor structure layer 59. For the purpose of explanation, the shapes and arrangement of the chip electrodes 57A and 57B are shown by broken lines in FIG. 18. As illustrated in FIG. 15, the chip electrode 57A includes the chip electrode pieces 57A1 to 57A6.

As illustrated in FIG. 18, the p-electrode layer 59AL has a portion perpendicular to the chip electrode 57A at the end opposite to the side on which the chip electrode 57B is provided. The vertical portion connects the opposite end of the portion of the p-electrode layer 59AL formed along the chip electrode 57A. Therefore, the p-electrode layer 59AL has a comb-tooth shape in which the base portion is the vertical portion and the comb-tooth portions are the portions formed along the chip electrode 57A.

The n-electrode layer 59CL has a portion formed along the chip electrode 57B and portions extending through a space between adjacent chip electrodes 57A (57A1 to 57A6) in parallel with the chip electrodes 57A. Accordingly, the n-electrode layer 59CL has a comb-tooth shape in which the portion formed along the chip electrode 57B is a base portion and portions extending through the respective spaces between adjacent chip electrodes 57A are comb-tooth portions.

As described above, the p-electrode layer 59AL and the n-electrode layer 59CL have a comb-tooth structure, and a more uniform current density can be obtained. Therefore, in the optical semiconductor element 51, since the bonding layer 55 extends to all the exposed surfaces 53S, the uniform current density due to the comb tooth structure is prevented from being impaired by the unbonded portion such as a void.

As described above, according to the present exemplary embodiment, the semiconductor structure layer 59 having the electrode layer with the comb tooth structure can be used to form the optical semiconductor element 51 in which the submount electrode 53 and the chip electrode 57 are provided corresponding to the comb tooth structure, and the bonding layer 55 extends to the exposed surfaces 53S at both ends of the respective submount electrode pieces 53A. That is, the chip electrode and the submount electrode corresponding to the comb tooth structure can be bonded by the bonding layer 55 having few unbonded portions such as voids. Accordingly, a more uniform current density can be obtained, and an optical semiconductor element with a longer service life can be provided. In addition, flatness of the bonding layer 55 can be ensured, and light distribution characteristics and light emission output as designed can be obtained.

In the aforementioned exemplary embodiments, the configuration in which the chip electrode in the predetermined position(s) is lacking has been described, but an insulating protective film may be provided in order to prevent a portion not covered with the chip electrode from coming into contact with the conductive bonding layer and short-circuiting.

It should be noted that the configuration shown in the aforementioned exemplary embodiment is merely an example, and can be selected, combined, and changed in accordance with use applications or the like. For example, conditions such as the shapes of the submount electrodes and the chip electrodes used in the optical semiconductor element of the present invention, the positions of the portions where the chip electrodes are lacking, and the like can be appropriately selected in accordance with the type of the semiconductor chip to be used, and the like.

As described above, according to the present invention, it is possible to provide an optical semiconductor element in which an unbonded portion between an electrode provided to an optical semiconductor chip and an electrode provided to a submount is made small, the heat dissipation efficiency becomes high, and the service life can be made long. In addition, it is possible to provide an optical semiconductor element in which the flatness of a bonding layer between an electrode provided to the optical semiconductor chip and an electrode provided to a submount is high and light distribution characteristics and light emission output as designed can be obtained.

It will be apparent to those skilled in the art that various modifications and variations can be made in the present invention without departing from the spirit or scope of the present invention. Thus, it is intended that the present invention cover the modifications and variations of the present invention provided they come within the scope of the appended claims and their equivalents. All related art references described above are hereby incorporated in their entirety by reference.

What is claimed is:

1. An optical semiconductor element comprising:
   a plate-shaped submount having a mounting surface;
   a submount electrode provided on the mounting surface of the submount and having a rectangular shape as a whole; and
   a semiconductor chip including an element substrate, a semiconductor structure layer formed on the element substrate, and a chip electrode bonded to the submount electrode via a bonding layer, wherein
   the chip electrode has a shape with chipped corners corresponding to four corners of the submount electrode,
   the submount electrode has an exposed surface that is a portion exposed from the chip electrode at the four corners and bonded to the chip electrode to coincide with each other, and
   the bonding layer extends to all the four corners of the exposed surface.

2. The optical semiconductor element according to claim 1, wherein the submount electrode includes two submount electrode pieces each having a rectangular shape and are disposed apart from each other, the chip electrode includes two chip electrode pieces each having a shape and arrangement that coincide with the respective submount electrode pieces except that corners thereof corresponding to the four corners of the submount electrode are lacking, and the two submount electrode pieces and the two chip electrode pieces are bonded to each other, while coinciding with each other, except for the four corners.

3. The optical semiconductor element according to claim 2, wherein each of the two chip electrode pieces has chipped corners corresponding to the respective four corners of the two submount electrode pieces, each of the two submount electrode pieces has the exposed surface at the respective four corners, and the bonding layer extends to all the exposed surfaces at the four corners.

4. The optical semiconductor element according to claim 1, wherein the submount electrode includes first to n-th (n≥2) submount electrode pieces each having a stripe shape and are disposed apart from each other, the chip electrode includes first to n-th chip electrode pieces each having a shape and arrangement that coincide with the respective submount electrode pieces except for corners thereof corresponding to the four corners of the submount electrode, and having both ends that correspond to both ends of the first to n-th submount electrode pieces and are lacking, and each of the submount electrode pieces and each of the chip electrode pieces are bonded to each other, while coinciding with each other, except for the four corners.

5. The optical semiconductor element according to claim 1, wherein the submount electrode includes first to n-th (n≥2) submount electrode pieces each having a stripe shape and are disposed apart from each other, the chip electrode includes first to n-th chip electrode pieces each having a shape and arrangement that coincide with the respective submount electrode pieces except for ends of the respective submount electrode pieces, and having both ends that correspond to both ends of the submount electrode pieces and are lacking, each of the submount electrode pieces has exposed surfaces at both the ends thereof which are exposed portions from each of the chip electrode pieces, and the bonding layer extends to the exposed surfaces of each of the submount electrode pieces.

6. The optical semiconductor element according to claim 4, wherein the first to n-th submount electrode pieces are disposed in n rows such that long sides of the stripe shapes are arranged in parallel with each other, the semiconductor chip has a chip-side opposite electrode apart from the first to n-th chip electrode pieces, and the submount has a submount-side opposite electrode that is disposed on the mounting surface apart from the submount electrode pieces and bonded to the chip-side opposite electrode via the bonding layer.

7. The optical semiconductor element according to claim 5, wherein the first to n-th submount electrode pieces are disposed in n rows such that long sides of the stripe shapes are arranged in parallel with each other, the semiconductor chip has a chip-side opposite electrode apart from the first to n-th chip electrode pieces, and the submount has a submount-side opposite electrode that is disposed on the mounting surface apart from the submount electrode pieces and bonded to the chip-side opposite electrode via the bonding layer.

8. The optical semiconductor element according to claim 6, wherein the semiconductor structure layer includes a first conductivity type semiconductor layer, an active layer, and a second conductivity type semiconductor layer, the first to n-th chip electrode pieces are electrically connected to the first conductivity type semiconductor layer, the first conductivity type semiconductor layer has a first electrode layer with a comb-tooth shape including a comb-tooth portion having a shape and an arrangement corresponding to the respective first to n-th chip electrode pieces, and a base portion connecting one ends of the comb-tooth portions, and the second conductive type semiconductor layer has a second electrode layer with a comb-tooth shape including a base portion electrically connected to the chip-side opposite electrode, and a comb-tooth portion extending in spaces between adjacent ones of the first to n-th chip electrode pieces.

9. The optical semiconductor element according to claim 7, wherein the semiconductor structure layer includes a first conductivity type semiconductor layer an active layer, and a second conductivity type semiconductor layer, the first to n-th chip electrode pieces are electrically connected to the first conductivity type semiconductor layer, the first conductivity type semiconductor layer has a first electrode layer with a comb-tooth shape including a comb-tooth portion having a shape and an arrangement corresponding to the respective first to n-th chip electrode pieces, and a base portion connecting one ends of the comb-tooth portions, and the second conductive type semiconductor layer has a second electrode layer with a comb-tooth shape including a base portion electrically connected to the chip-side opposite electrode, and a comb-tooth portion extending in spaces between adjacent ones of the first to n-th chip electrode pieces.

10. The optical semiconductor element according to claim 1, wherein the bonding layer extends to cover all the respective exposed surfaces.

11. The optical semiconductor element according to claim 2, wherein the bonding layer extends to cover all the respective exposed surfaces.

12. The optical semiconductor element according to claim 1, wherein the element substrate has a light-transmitting property with respect to light at a predetermined wavelength.

13. The optical semiconductor element according to claim 2, wherein the element substrate has a light-transmitting property with respect to light at a predetermined wavelength.

14. The optical semiconductor element according to claim 1, wherein the element substrate has a light-transmitting property with respect to light in a visible wavelength region.

15. The optical semiconductor element according to claim 2, wherein the element substrate has a light-transmitting property with respect to light in a visible wavelength region.

16. An optical semiconductor element comprising:
a plate-shaped submount having a mounting surface;
a submount electrode provided on the mounting surface of the submount; and
a semiconductor chip including an element substrate, a semiconductor structure layer formed on the element substrate, and a chip electrode bonded to the submount electrode via a bonding layer, and having a rectangular shape as a whole, wherein
the chip electrode has a shape with chipped corners corresponding to four corners of the submount electrode,
the chip electrode has an exposed surface that is a portion exposed from the submount electrode at the four corners and bonded to the submount electrode to coincide with each other, and
the bonding layer extends to all the four corners of the exposed surfaces.

17. The optical semiconductor element according to claim 16, wherein the submount has a light-transmitting property with respect to light at a predetermined wavelength.

* * * * *